(12) United States Patent
Brueck et al.

(10) Patent No.: US 6,233,044 B1
(45) Date of Patent: May 15, 2001

(54) METHODS AND APPARATUS FOR INTEGRATING OPTICAL AND INTERFEROMETRIC LITHOGRAPHY TO PRODUCE COMPLEX PATTERNS

(76) Inventors: Steven R. J. Brueck, 5601 Cometa Ct. NE., Albuquerque, NM (US) 87111-1910; Xiaolan Chen, 9490 SW. 146th Terr., #6, Beaverton, OR (US) 97007; Andrew Frauenglass, 417 Girard St., Albuquerque, NM (US) 87106; Saleem H. Zaidi, 9813 Fostonia Rd., NE., Albuquerque, NM (US) 87111; Janusz Wilczynski, 11 Rue du Soleil, Sandia Park, NM (US) 87047-9337

( * ) Notice: Subject to any disclaimer, the term of this patent is extended or adjusted under 35 U.S.C. 154(b) by 0 days.

(21) Appl. No.: 09/273,399

(22) Filed: Mar. 22, 1999

Related U.S. Application Data

(63) Continuation-in-part of application No. 08/786,066, filed on Jan. 21, 1997, now abandoned.
(60) Provisional application No. 60/111,340, filed on Dec. 7, 1998, and provisional application No. 60/103,997, filed on Oct. 12, 1998.

(51) Int. Cl.⁷ .......................... G03B 27/54; G03B 27/32; G03C 5/00
(52) U.S. Cl. ................ 355/67; 355/77; 430/312; 430/316
(58) Field of Search .................... 355/53, 67, 71, 355/77; 250/492.2, 492.22; 430/311, 312, 316, 5, 20, 22, 30

(56) References Cited

U.S. PATENT DOCUMENTS

| Re. 36,113 | 2/1999 | Brueck et al. ............ 430/311 |
| 4,881,236 | 11/1989 | Brueck et al. ............ 372/45 |
| 4,987,461 | 1/1991 | Brueck et al. ............ 357/19 |
| 5,216,257 | 6/1993 | Brueck et al. ............ 250/548 |
| 5,239,407 | 8/1993 | Brueck et al. ............ 359/326 |
| 5,247,601 | 9/1993 | Myers et al. ............ 385/122 |
| 5,343,292 | 8/1994 | Brueck et al. ............ 356/363 |
| 5,415,835 | * 5/1995 | Brueck et al. ............ 430/311 |

(List continued on next page.)

FOREIGN PATENT DOCUMENTS

WO 96/26468   8/1996  (WO).

OTHER PUBLICATIONS

"Interferometric lithography of sub–micrometer sparse hole arrays for field–emission display applications", X. Chen, et al., J. Vac. Sci. Technol. B 14(5), Sep./Oct. 1996, 3339–3349.

"Multiple–exposure interferometric lithography", S. Zaidi, et al., J. Vac. Sci. Technol. B 11(3), May/Jun. 1993, 658–666.

Primary Examiner—David M. Gray
Assistant Examiner—Henry Hung Nguyen
(74) Attorney, Agent, or Firm—Snell & Wilmer LLP

(57) ABSTRACT

The present invention provides methods and apparatus for defining a single structure on a semiconductor wafer by spatial frequency components whereby some of the spatial frequency components are derived by optical lithography and some by interferometric lithographic techniques. Interferometric lithography images the high frequency components while optical lithography images the low frequency components. Optics collects many spatial frequencies and the interferometry shifts the spatial frequencies to high spatial frequencies. Thus, because the mask does not need to provide high spatial frequencies, the masks are configured to create only low frequency components, thereby allowing fabrication of simpler masks having larger structures. These methods and apparatus facilitate writing more complex repetitive as well as non-repetitive patterns in a single exposure with a resolution which is higher than that currently available using known optical lithography alone.

35 Claims, 25 Drawing Sheets

U.S. PATENT DOCUMENTS

| | | | |
|---|---|---|---|
| 5,426,498 | 6/1995 | Brueck et al. | 356/35.5 |
| 5,440,426 | 8/1995 | Sandstrom | 359/559 |
| 5,573,890 * | 11/1996 | Spence | 430/311 |
| 5,617,499 | 4/1997 | Brueck et al. | 385/122 |
| 5,674,652 * | 10/1997 | Bishop et al. | 430/30 |
| 5,680,588 * | 10/1997 | Gortych et al. | 395/500 |
| 5,705,321 | 1/1998 | Brueck et al. | 430/316 |
| 5,759,744 | 6/1998 | Brueck et al. | 430/312 |
| 5,830,611 | 11/1998 | Bishop et al. | 430/30 |
| 5,915,048 * | 6/1999 | Hill et al. | 382/100 |

* cited by examiner

In-focus

In-focus

Out of focus

Out of focus

CD = 100 nm　　CD = 50 nm　　CD = 150 nm　　CD = 90 nm

Pitch = 360 nm　Pitch = 2　　Pitch = 300 nm　Pitch = 180 nm

METHODS AND APPARATUS FOR INTEGRATING OPTICAL AND INTERFEROMETRIC LITHOGRAPHY TO PRODUCE COMPLEX PATTERNS

CROSS-REFERENCE TO RELATED APPLICATIONS

This application is a Continuation-In-Part of U.S. Ser. No. 08/786,066 Jan. 21, 1997 which is now abandoned which is now abandoned and claims the benefit of U.S. Provisional Application Ser. No. 60/111,340 filed on Dec. 7, 1998 entitled "Arbitrary Lithographic Patterns" with inventors S. R. J. Brueck, Xiaolan Chen, Andrew Frauenglass and Saleem H. Zaidi and claims the benefit of U.S. Provisional Application Ser. No. 60/103,997 filed on Oct. 12, 1998 entitled "Pupil Plane Filters" with inventors S. R. J. Brueck and Xiaolan Chen.

GOVERNMENT RIGHTS

This invention was made in the performance of work pursuant to DARPA/Department of the NAVY Grant # N66001-96-C8617 dated May 29, 1996 for a two year term.

TECHNICAL FIELD

The present invention relates, generally, to the use of interferometric techniques to produce repetitive structures during semiconductor fabrication and, more particularly, to the integration of interferometric lithography with optical lithography to produce arbitrarily complex patterns on wafers.

BACKGROUND ART AND TECHNICAL PROBLEMS

Progress in the production of integrated circuits employing very large scale integration (VLSI) has been characterized by an ever decreasing feature size. Transverse dimensions of transistor features have decreased from ~5 micrometers in 1970 (4K DRAM) to 0.35 micrometers today (64M DRAM). This continuous improvement in feature size is an integral part of "Moore's Law", which projects an exponential feature size decrease characterized by a reduction of 30% in linear dimensions every three years. This "law" underlies the semiconductor industry planning as exemplified in the "National Technology Roadmap for Semiconductors" (Semiconductor Industry Association, 1994), incorporated herein by this reference.

Throughout this progress, optical lithography has remained the dominant lithographic technique for manufacturing applications. Many advances have been made in optical lithography to allow this dramatic scale reduction. The optical wavelength used in state-of-the-art lithographic tools has decreased from mercury G-line (436 nm) to mercury I-line (365 nm) to 248 DUV (KrF laser). Currently, 193 nm ArF laser-based steppers are being developed, continuing this historical trend. At the same time optical systems have been improved from numerical apertures (NA) of 0.2 to ~0.6–0.7.

There are several factors which together suggest that additional major improvements along these directions are not likely, and that the industry will have to undergo a significant change in lithographic technique. Chief among these factors is the reduction of the feature size to below the available optical wavelengths. Additionally, there is an increasing premium on line width control for high-speed circuit operation, even as the scale reduction below the wavelength is making line width control more difficult. For wavelengths below the 193 nm ArF wavelength, transmitting optical materials are believed to be unavailable, and a transition to an all-reflective system will likely be required. This is problematical since current multi-layer reflector and aspheric optical technologies are not sufficiently developed to meet these needs. Most likely, the transition to reflective optics will result in a significant reduction in the possible NAs, reducing the benefit of shorter wavelengths.

Optical sources with sufficient average power for high throughput manufacturing are another major problem for wavelengths shorter than 193 nm. EUV lithography is a promising approach based on a laser-produced plasma source and 5× reduction, aspheric, all-reflective optics with multi layer reflectors. However, it is not yet clear whether this program will lead to a cost effective lithography tool that can timely meet the needs of the industry for the next generation lithographic capability.

A further factor suggesting a substantial change in lithographic techniques surrounds the complexity of the masks required for future ULSI generations. This complexity is, by definition, increasing by a factor of four each generation (i.e., four times as many transistors on a chip). In addition, many of the potential solutions to the optical lithography problem, collectively known as resolution-enhancement techniques, lead to increased mask complexity (e.g., with the introduction of serifs, helper bars, and other sub-resolution features) or require a three-dimensional mask in place of the traditional chrome-on-glass two-dimensional masks (phase shift techniques). These trends are increasing the difficulty and cost of producing ULSI structures at high yields.

A number of alternative lithographic technologies are being investigated. These include: X-ray, e-beam, ion-beam and probe-tip technologies. Each of these has its advantages and disadvantages, but it is safe to state that none of them has as yet emerged as a satisfactory alternative to optical lithography.

Interferometric lithography, i.e., the use of the standing wave pattern produced by two or more coherent optical beams to expose a photoresist layer, has recently been demonstrated to provide a very simple technique to produce the requisite scale for the next several ULSI generations. See, for example, U.S. Pat. No. 5,415,835, issued May 16, 1995, to Steven R. J. Brueck, Saleem Zaidi and An-Shyang Chu, entitled *Fine-Line Interferometric Lithography*; U.S. Pat. No. 5,216,257, issued Jun. 1, 1993, to Steven R. J. Brueck and Saleem H. Zaidi, entitled *Overlay of Submicron Lithographic Features*; U.S. Pat. No. 5,343,292, issued Aug. 30, 1994, to Steven R. J. Brueck and Saleem H. Zaidi, entitled *Method and Apparatus for Alignment of Submicron Lithographic Features*; U.S. patent application Ser. No. 07/662,676, filed Feb. 2, 1991, by Kenneth P. Bishop, Steven R. J. Brueck, Susan M. Gaspar, Kirt C. Hickman, John R. McNeil, S. Sohail H. Naqvi, Brian R. Stallard and Gary D. Tipton, entitled *Use of Diffracted Light from Latent Images in Photoresist for Exposure Control*; U.S. Pat. No. 5,759,744 issued on Jun. 2, 1998 and U.S. Ser. No. 08/614,991, filed on Jul. 15, 1998, by Steven R. J. Brueck, Xiaolan Chen, Saleem Zaidi and Daniel J. Devine, entitled Methods and Apparatuses for *Lithography of Sparse Arrays of Sub-Micrometer Features*; U.S. Pat. No. 5,247,601, issued Sep. 21, 1993, to Richard A. Myers. Nandini Mukherjee and Steven R. J. Brueck, entitled *Arrangement for Producing Large Second-Order Optical Nonlinearities in a Waveguide Structure Including Amorphous SIO2*; U.S. Pat. No. 5,239,407, issued Aug. 24, 1993, to Steven R. J. Brueck, Richard A. Myers, Anadi Muskerjee and Adam Wu, entitled *Methods and*

Apparatus for Large Second-Order Nonlinearities in Fused Silica; U.S. Pat. No. 4,987,461, issued Jan. 22, 1991, to Steven R. J. Brueck, S. Schubert, Kristin McArdle and Bill W. Mullins, entitled High Position Resolution Sensor with Rectifying Contacts; U.S. Pat. No. 4,881,236, issued Nov. 14, 1989, to Steven R. J. Brueck, Christian F. Schauss, Marek A. Osinski, John G. McInerney, M. Yasin A. Raja, Thomas M. Brennan and Burrell E. Hammons, entitled Wavelength-Resonant Surface-Emitting Semiconductor Laser, U.S. patent application Ser. No. 08/635,565, filed Sep. 16, 1992, by Steven R. J. Brueck, Saleem Zaidi and An-Shyang Chu, entitled Method for Fine-Line Interferometric Lithography; U.S. CIP Patent Application Ser. No. 08/407,067, filed Mar. 16, 1995, by Steven R. J. Brueck, Xiaolan Chen, Saleem Zaidi and Daniel J. Devine, entitled Methods and Apparatus for Lithography of Sparse Arrays of Sub-Micrometer Features; U.S. patent application Ser. No. 08/123,543, filed Sep. 20, 1993, by Steven R. J. Brueck, An-Shyang Chu, Bruce L. Draper and Saleem H. Zaidi, entitled Method for Manufacture of Quantum Sized Periodic Structures in Si Materials, U.S. Pat. No. 5,705,321, filed Jun. 6, 1995, by Steven R. J. Brueck, An-Shyang Chu, Bruce L. Draper and Saleem Zaidi, entitled Method for Manufacture of Quantum Sized Periodic Structures in Si Materials, U.S. DIV patent application Ser. No. 08/719,896, filed Sep. 25, 1996, by Steven R. J. Brueck, An-Shyang Chu, Bruce L. Draper and Saleem H. Zaidi, entitled Manufacture of Quantum Sized Periodic Structures in Si Materials; U.S. patent application Ser. No. 07/847,618, filed Mar. 5, 1992, by Kenneth P. Bishop, Lisa M. Milner, S. Sohail H. Naqvi, John R. McNeil and Bruce L. Draper, entitled Use of Diffracted Light from Latent Images in Photoresist for Optimizing Image Contrast; U.S. patent application Ser. No. 08/525, 960, filed Sep. 8, 1995, by Steven R. J. Brueck and Xiang-Cun Long, entitled Technique for Fabrication of a Poled Electrooptic Fiber Segment, U.S. Pat. No. 5,426,498, filed Jun. 20, 1995, by Steven R. J. Brueck, David B. Burckel, Andrew Frauenglass and Saleem Zaidi, entitled Method and Apparatus for Real-time Speckle Interferometry for Strain or Displacement of an Object Surface; SIA, National Technology Roadmap for Semiconductors (1994); J. W. Goodman, Introduction to Fourier Optics, 2nd Ed. (McGraw Hill, NY 1996); J. W. Goodman, Statistical Optics (John Wiley, NY 1985); Xiaolan Chen, S. H. Zaidi, S. R. J. Brueck and D. J. Devine, Interferometric Lithography of Sub-Micrometer Sparse Hole Arrays for Field-Emission Display Applications (Jour. Vac. Sci. Tech B14, 3339–3349, 1996); S. H. Zaidi and S. R. J. Brueck, Multiple-Exposure Interferometric Lithography (Jour. Vac. Sci. Tech. B11, 658, 1992); A. Yariv, Introduction to Optical Electronics (Holt, Reinhard and Winston, NY 1971). The entire contents of the foregoing are hereby incorporate herein by this reference.

The limiting spatial frequency in interferometric lithography is generally regarded as $\sim\lambda/2$, where $\lambda$ is the laser wavelength, and the critical dimension (CD) for 1:1 lines and spaces is $\lambda/4$. This should be contrasted with the limiting CD of imaging optical systems which is usually stated as $k_1\lambda/NA$, where $k$, is a function of manufacturing tolerances as well as of the optical system, $\lambda$ Is the center wavelength of the exposure system, and NA is the numerical aperture of the imaging optical system. Typical values of $k_1$ range from 1.0 down to $\sim0.6$. This is an oversimplified description of the limiting scales, but serves to illustrate the major points. Projections for the 193 wavelength optical lithography tool are an NA of 0.6 which leads to a limiting CD of $\sim0.19$ micrometer. In contrast, at I-line (365 nm) interferometric lithography has a limiting resolution of $\sim0.09$ micrometer. Using the 193 wavelength, the limiting resolution of interferometric lithography is $\sim0.05$ micrometer. This is already better than the current projections for EUV lithography (a wavelength of 13 nm and a NA of 0.1 leading to a CD of 0.08 micrometer at a $k_1$ of 0.6).

A major obstacle associated with interferometric lithography surrounds the development of sufficient pattern flexibility to produce useful circuit patterns in the VLSI and ULSI context. A two-beam interferometric exposure simply produces a periodic pattern of lines and spaces over the entire field. Multiple beam (4 or 5) exposures produce two-dimensional structures, but also of relatively simple repeating patterns such as holes or posts. More complex structures can be made by using multiple interferometric exposures, for example as described in U.S. Pat. No. 5,415, 835, issued May 16, 1995, to S. R. J. Brueck and Saleem H. Zaidi, entitled Method and Apparatus for Fine-Line Interferometric Lithography and in Jour. Vac. Sci. Tech. B11 658 (1992). Additional flexibility may be attained by combining interferometric and optical lithography as also described in the above patent. Thus far, demonstrations include relatively simple examples, e.g., defining an array of lines by interferometric lithography and delimiting the field by a second optical exposure. Multiple exposures have been demonstrated to produce more complex, but still repetitive structures.

In addition to limited pattern flexibility, presently known interferometric lithography techniques lack a well-defined synthesis procedure for obtaining a desired structure.

A technique is thus needed which overcomes, inter a/ia, the foregoing drawbacks associated with prior art techniques.

SUMMARY OF THE INVENTION

The present invention provides methods and apparatus for integrating optical lithography and interferometric lithography in a manner which overcomes many of the shortcomings of the prior art.

A preferred embodiment of the present invention provides methods and apparatus for parsing the lithographic tasks between optical and interferometric lithographic techniques. In accordance with a particularly preferred embodiment, an optical system is provided which facilitates the integration of interferometric lithography and optical lithography to produce complex structures on the same workpiece, for example a semi-conductor wafer. In a preferred exemplary embodiment, two masks are configured to intercept two portions of a uniform, collimated optical beam which is imaged by the optical system onto the wafer. An interferometric optical system is incorporated into the apparatus to bring the two mask images onto the wafer at substantially equal and opposite angles with respect to a wafer normal plane. In accordance with this preferred embodiment, the masks are suitably tilted relative to the optical axis in order to produce image planes which are coincident with the wafer plane after passing through the interferometric optics.

A preferred embodiment of the present invention derives from an understanding of the frequency space aspects of image formation. Current optical lithography techniques typically provide a band-limited approximation to an image. Interferometric lithography techniques provide a means to add higher spatial frequencies beyond those accessible by state-of-the-art optical techniques. A frequency space model provides a parsing technique to allow assignment of image frequency components to optical and interferometric means. Offset imaging interferometric exposures allow imaging of a wide range of optical frequencies outside of the bandpass of traditional optical imaging techniques. Thus, the present invention suitably splits the exposure into low frequency components that are handled by traditional optics and high frequency components that can be supplied by interferometric lithography if only a small number of frequencies is needed or by imaging interferometric lithography if a broad range of frequencies is needed.

In another particularly preferred embodiment of the present invention, the optical system is configured to bring the mask diffraction components corresponding to high spatial frequencies of the image, offset by off-axis illumination, onto the wafer about normal incidence and the second mask is imaged at a high angle of incidence such that the interference between the first and second mask images substantially corresponds to the desired high frequency components of the image in the direction of the offset. An additional exposure provides the high frequency image components in a substantially orthogonal direction. A third, conventional exposure provides the lower frequency image components. Thus, the demonstrated optical arrangements preferably include the wafer normal to the lens optical axis, off-axis illumination to shift the frequency components into the lens bandpass, and an interferometric reference to reset the frequencies at the wafer.

In accordance with a further aspect of the present invention, a formal parsing procedure is proposed for separating an arbitrary desired pattern into a number of specified interferometric and optical lithography exposures.

In accordance with a further aspect of the present invention, multiple beam interferometric lithography is extended to include a number of discrete spatial frequencies or, alternatively, a continuous range of spatial frequencies, to thereby facilitate writing more complex repetitive as well as non-repetitive patterns in a single exposure.

In accordance with a further aspect of the present invention, methods and apparatus are provided for combining extended multiple beam interferometric lithography with optical lithography to produce arbitrary structures at a resolution which is higher than that currently available using known optical lithography alone.

In accordance with a further aspect of the present invention, methods and apparatus are provided for optically defining the masks employed in interferometric exposures.

In accordance with yet a further aspect of the present invention, methods and apparatus are provided for reducing the complexity of masks used in the optical lithography portion of a combined optical and interferometric lithography exposure.

The resolution limits of conventional optical lithography (OL) reflect the low-pass spatial frequency (NA/$\lambda$) filter characteristics of the imaging system. Imaging interferometric lithography (IIL) extends the resolution of OL to the spatial frequency limits of optics (2/$\lambda$). Off-axis illumination downshifts the high frequency components of the mask pattern. An interferometric beam at the wafer upshifts these frequency components back to their original spatial frequencies following the lens. 2× reduction IIL experiments demonstrate a continuous frequency coverage up to ~3NA/$\lambda$ with a consequent threefold resolution enhancement.

BRIEF DESCRIPTION OF THE DRAWING FIGURES

The present invention will hereinafter be described in conjunction with the appended drawing figures, wherein like designations denote like elements, and:

FIG. 1 is a schematic representation of the decomposition of a specific structure into rectangles for facilitating a Fourier transform, with the rectangles shown slightly offset for clarity;

FIG. 2 is an exemplary graph of optical transfer functions for coherent and incoherent illumination, FIG. 3 are graphical examples of prior art VLSI patterns at a 0.18 micrometers CD written by diffraction-limited optical lithography tools at prescribed wavelengths and NAs; the left-hand column represents the results of incoherent illumination, and the right-hand column sets forth the results of coherent illumination;

FIG. 4 illustrates examples of VLSI patterns at a 0.18 micrometer CD written using a combination of optical and interferometric exposures;

FIG. 5 sets forth a simplification of the mask structure in the context of integrated optical and interferometric lithographic techniques;

Figure 6:
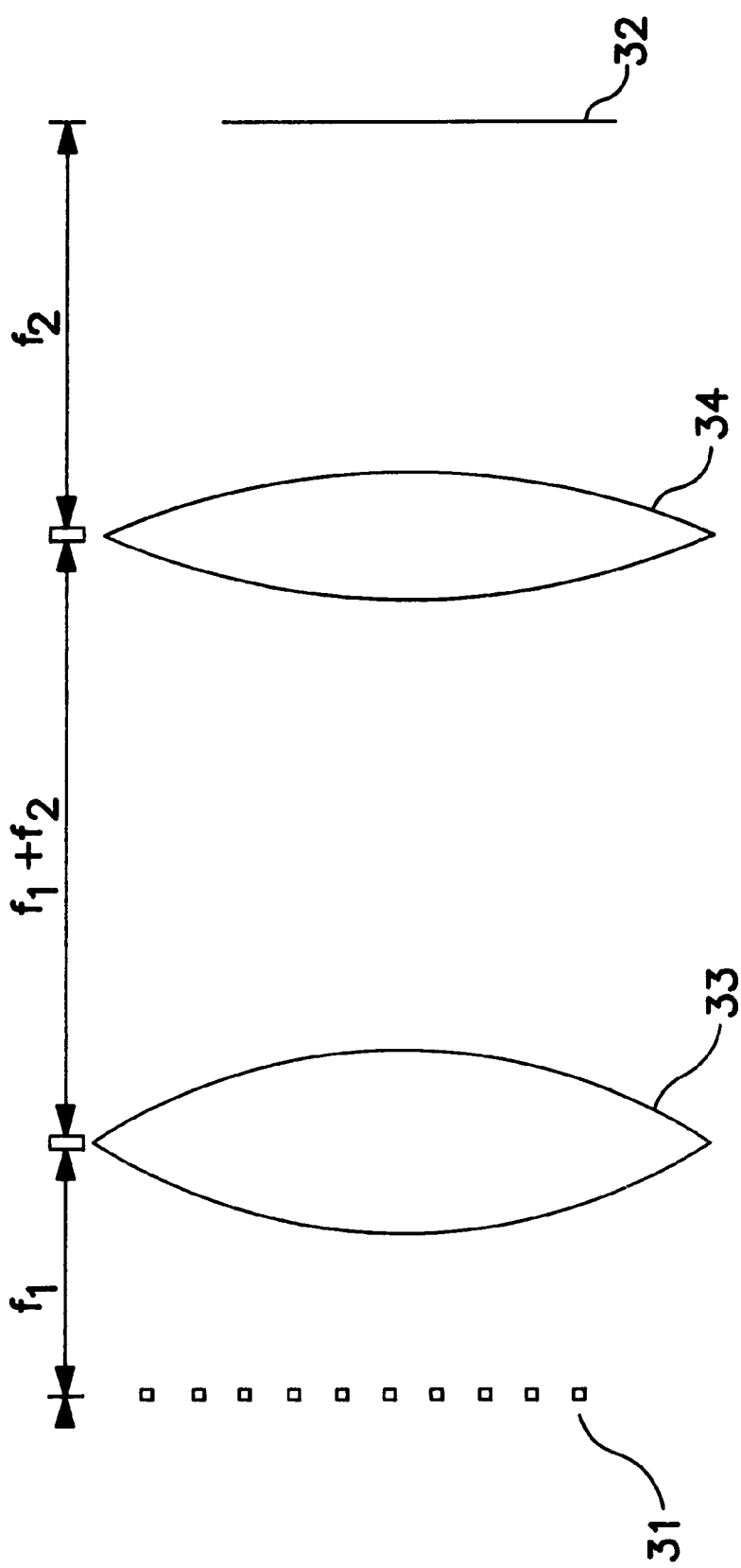
FIG. 6 is a schematic representation of an exemplary optical system useful in imaging a field stop onto a wafer in accordance with a preferred embodiment of the present invention.
Figure 11A:
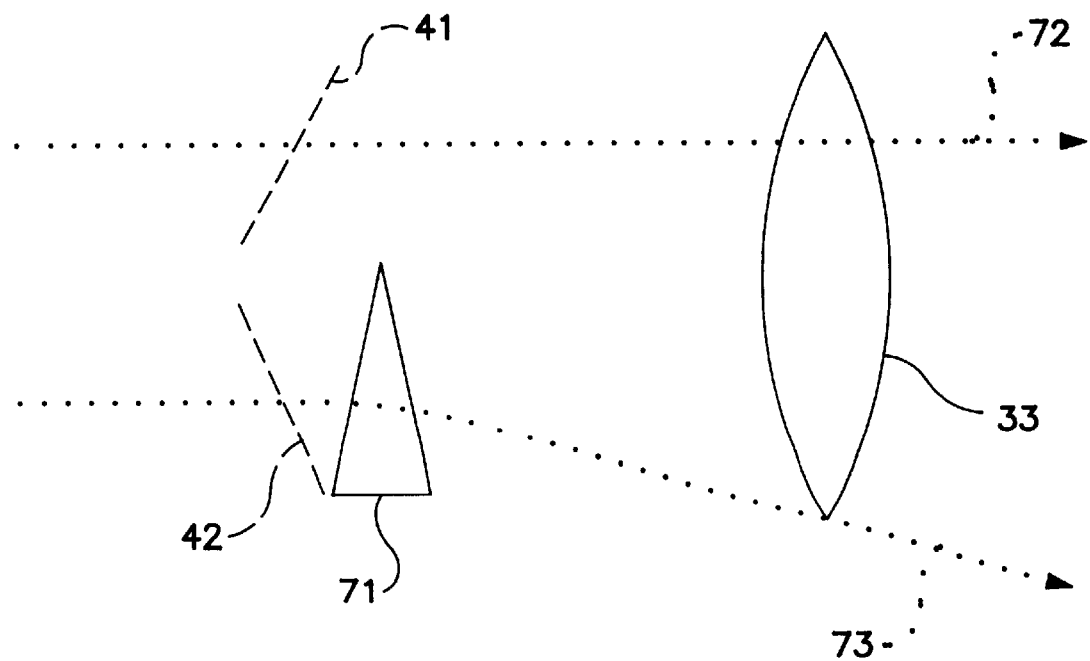
FIG. 11A is a schematic representation of an optical system for biasing the spatial frequency content of an image away from the zero center frequency in accordance with a preferred embodiment of the present invention.
Figure 11B:
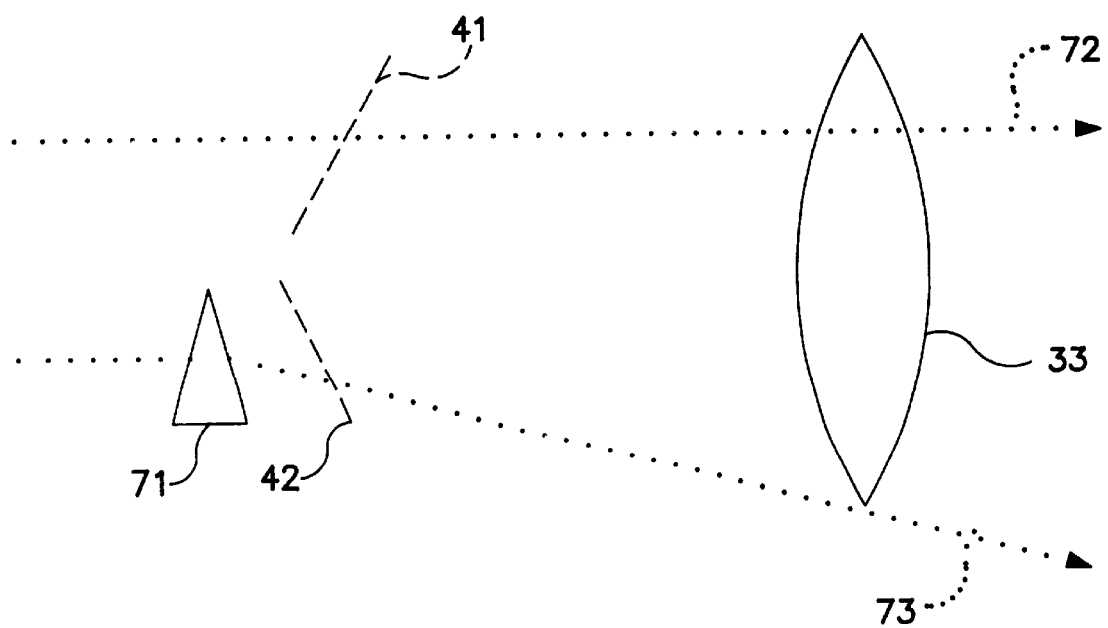
FIG. 11B is an alternative embodiment of the schematic representation shown in FIG. 11A.
Figure 11C:
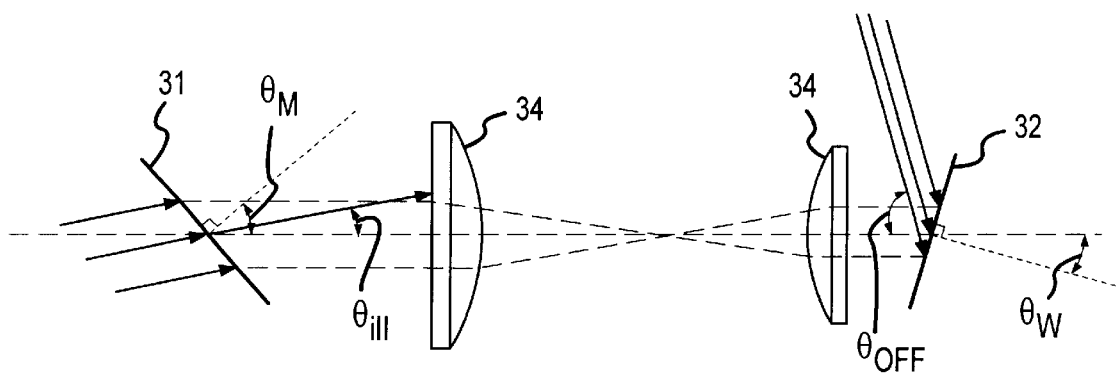
FIG. 11C is a general exemplary embodiment showing both an off-axis illumination of the mask and a corresponding offset reference beam illumination of the wafer.
Figure 11D:
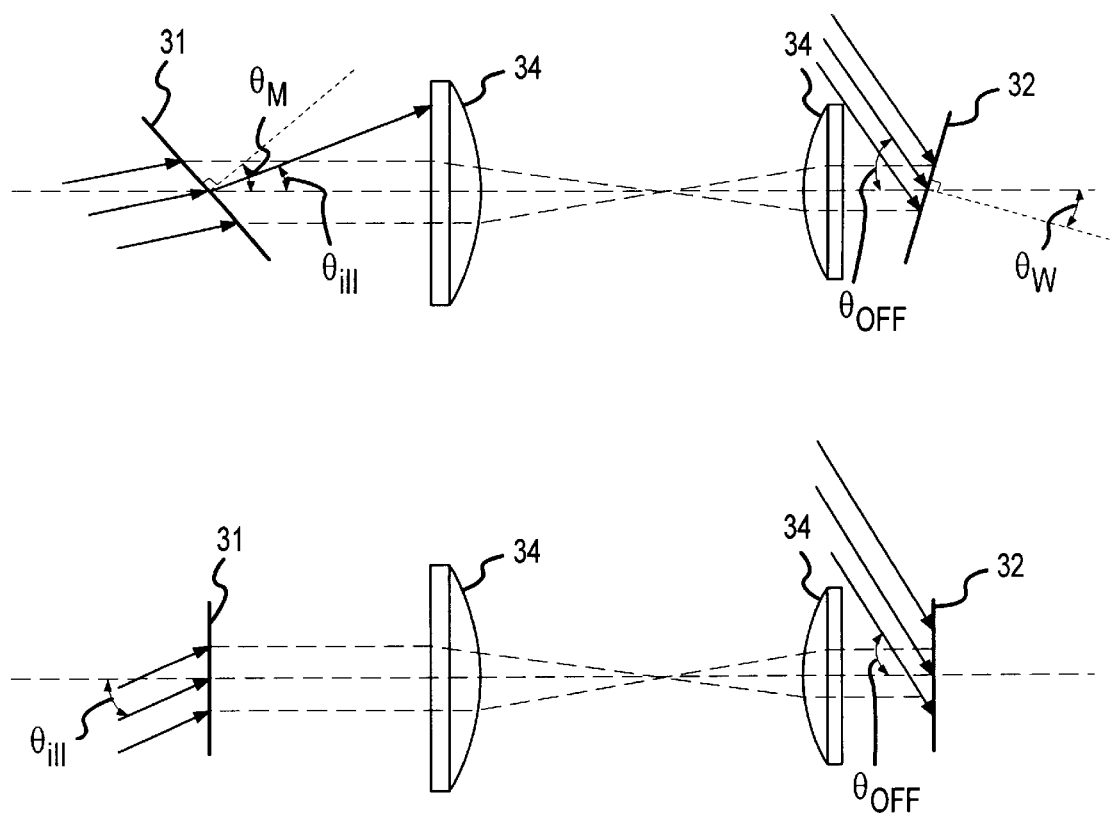
Figure 11E:
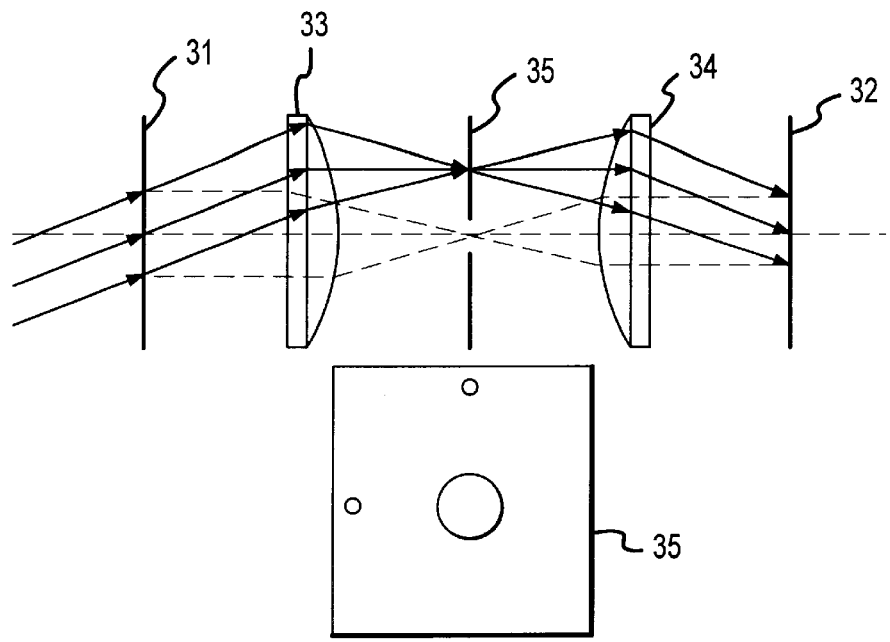
Figure 11F:
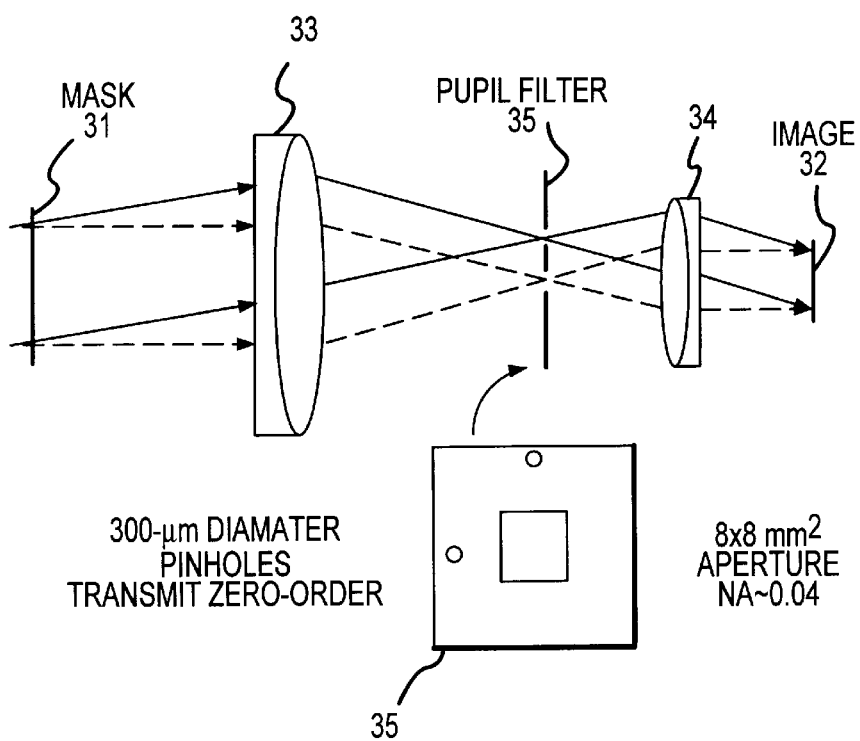
Figure 12A:
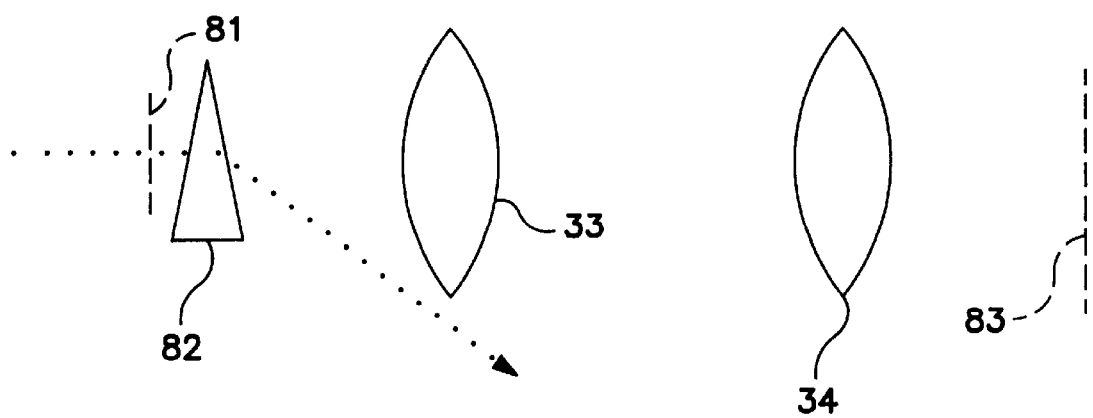
Figure 12B:
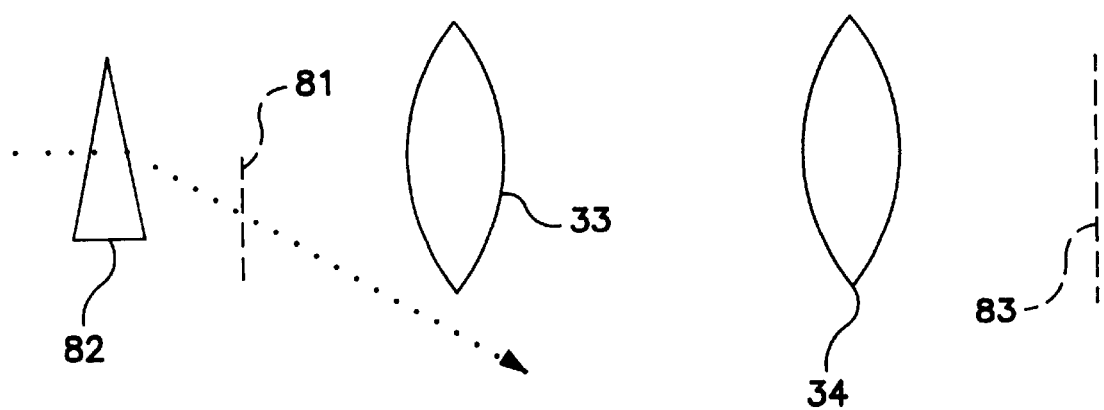
Figure 13:
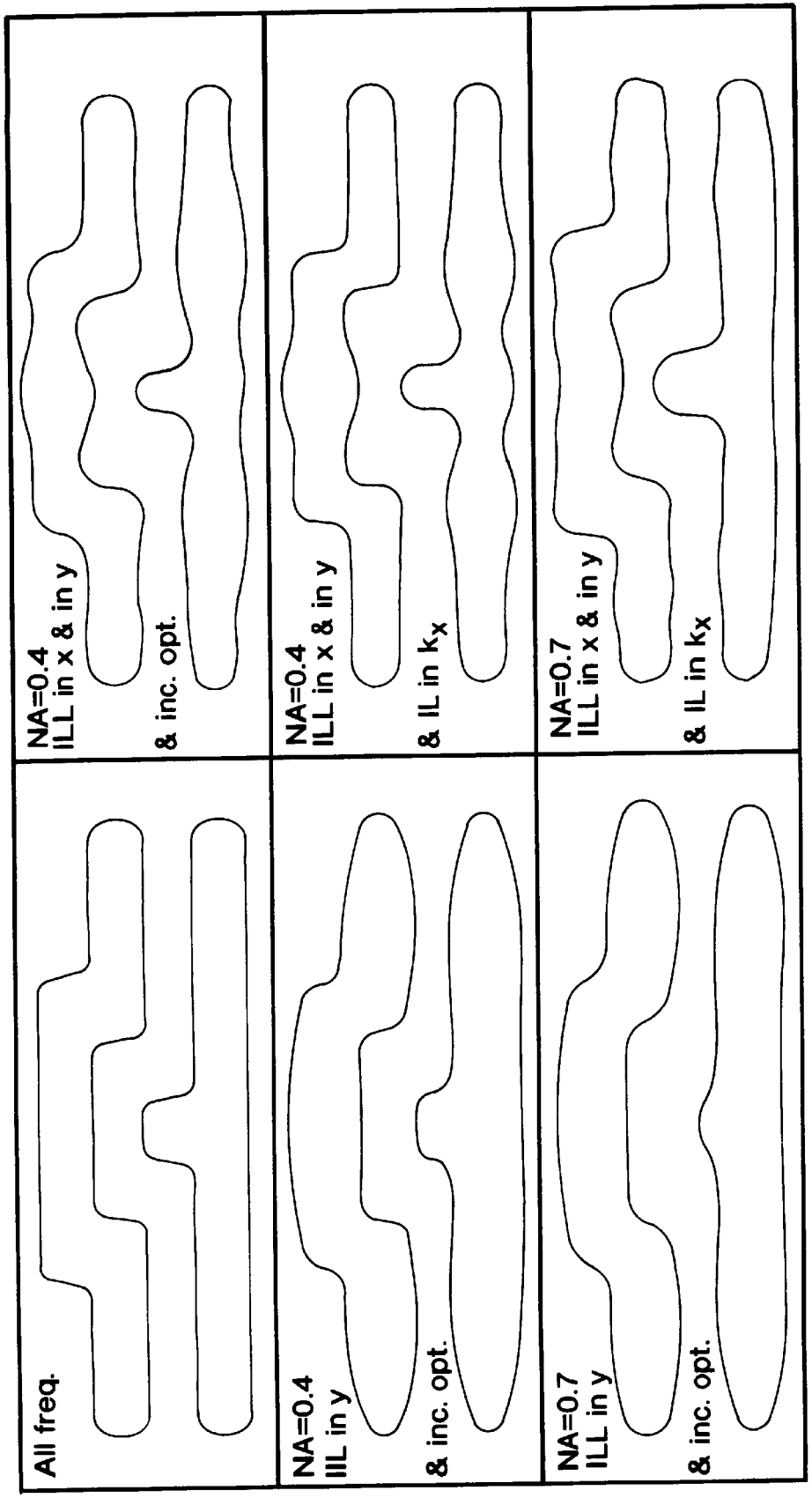
Figure 14A:
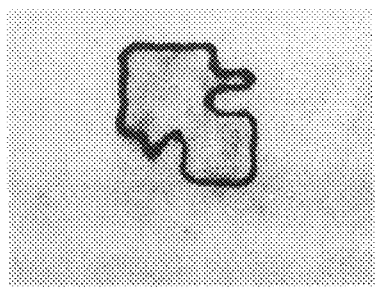
Figure 14C:
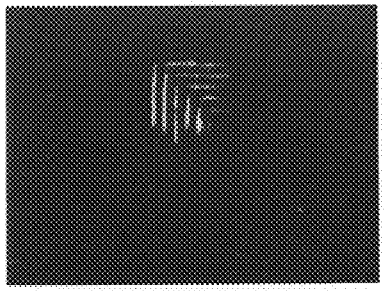
Figure 14E:
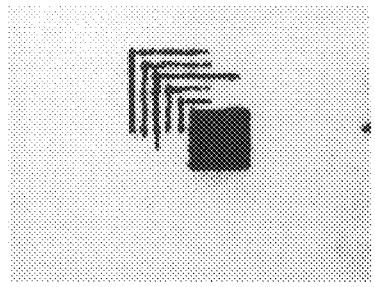
Figure 14B:
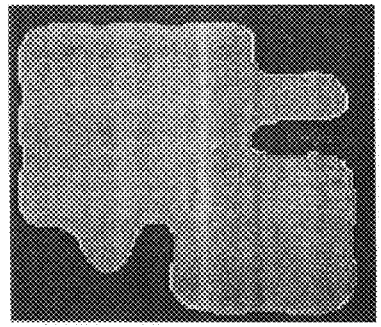
Figure 14D:
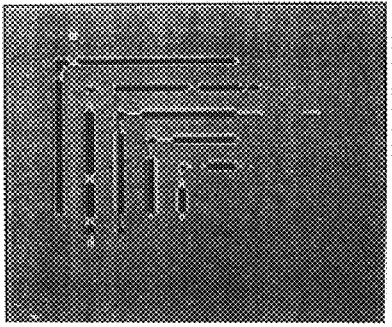
Figure 14F:
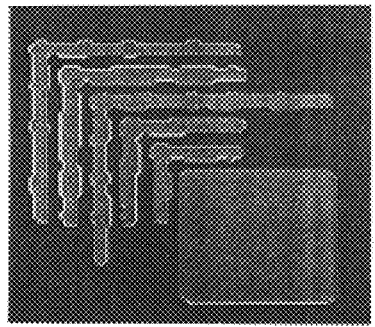
Figure 15:
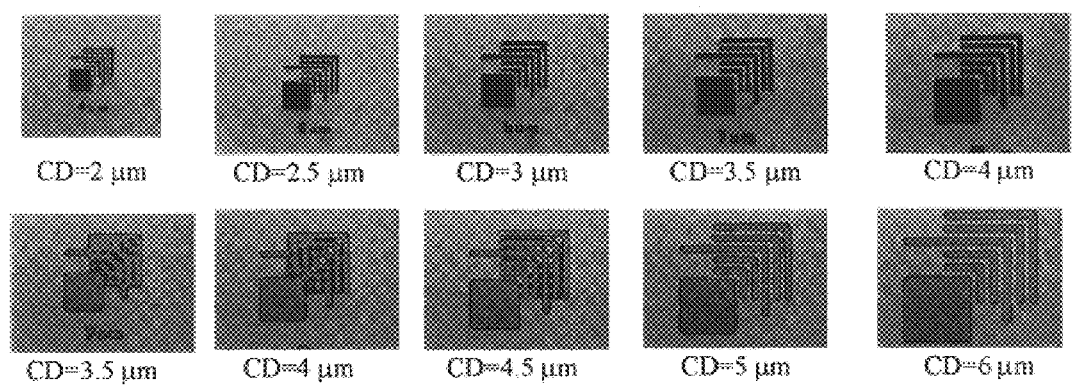
Figure 17:
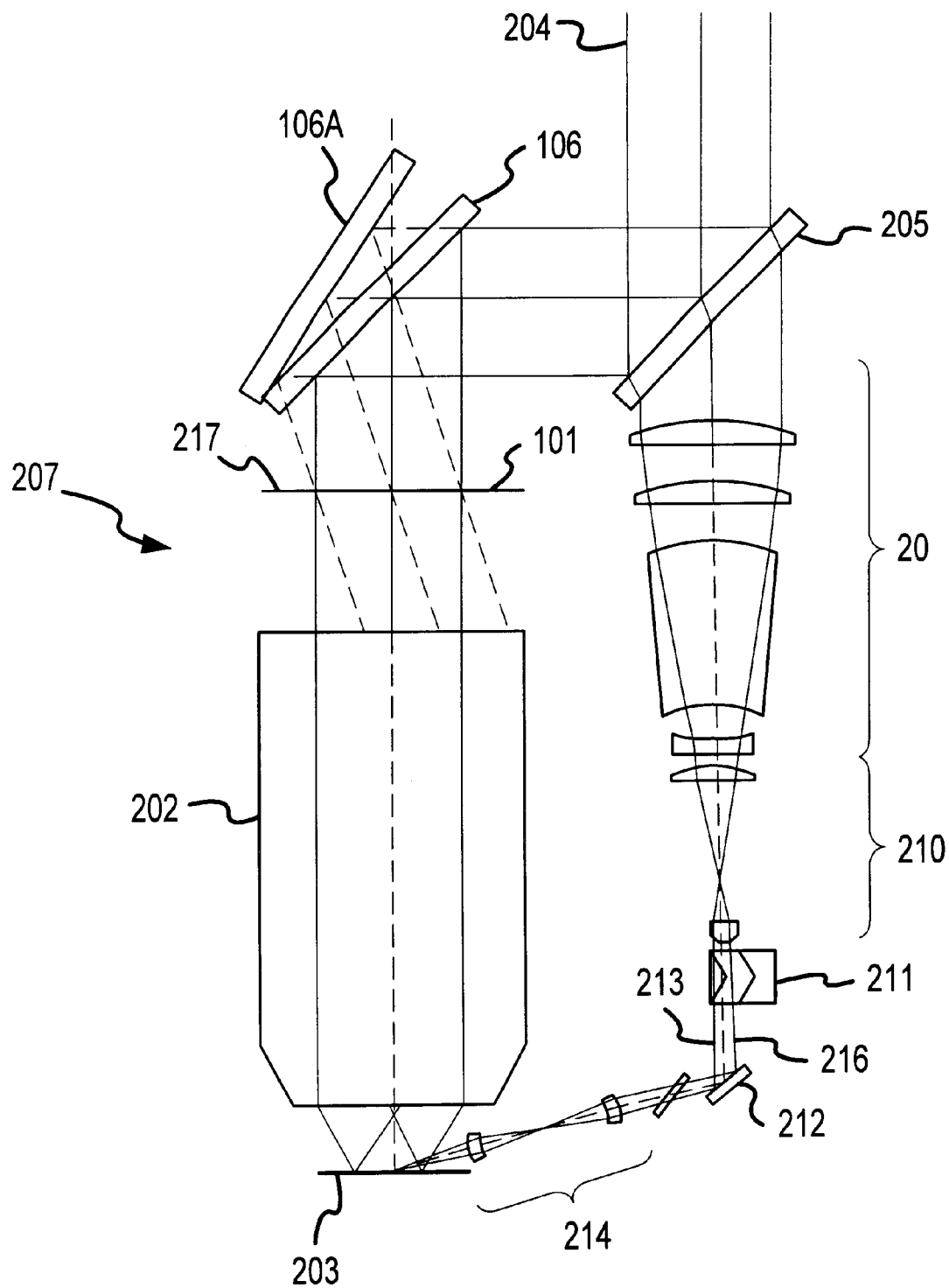
Figures 18A, 18B, 18C, 18D:
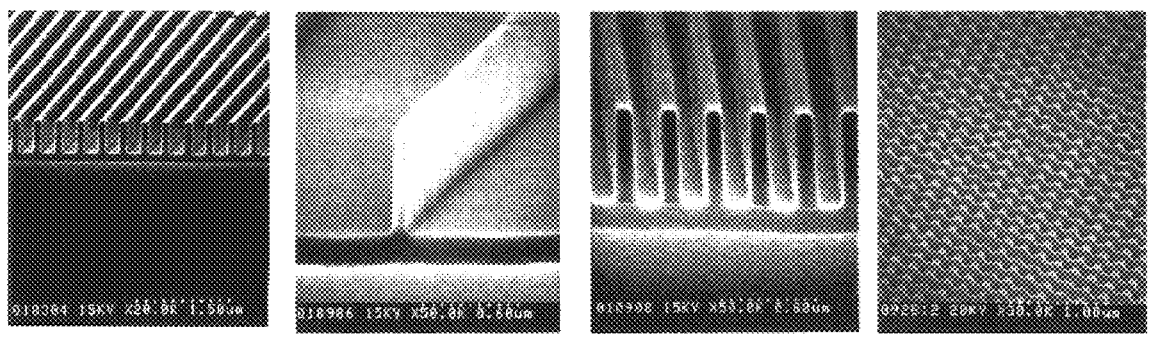
Figure 19A:
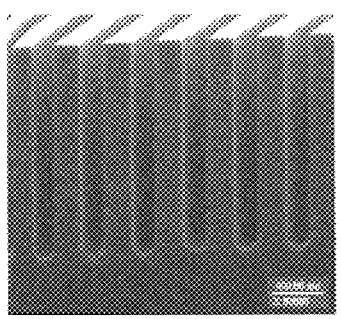
Figure 19B:
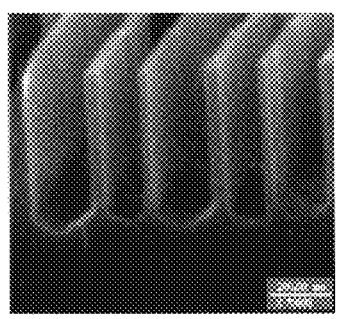
Figure 19C:
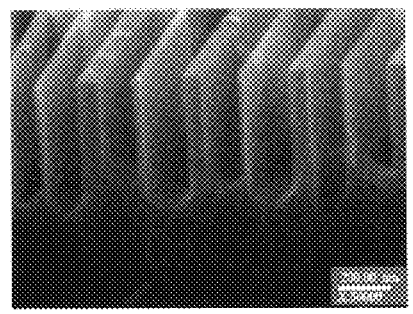
Figure 20:
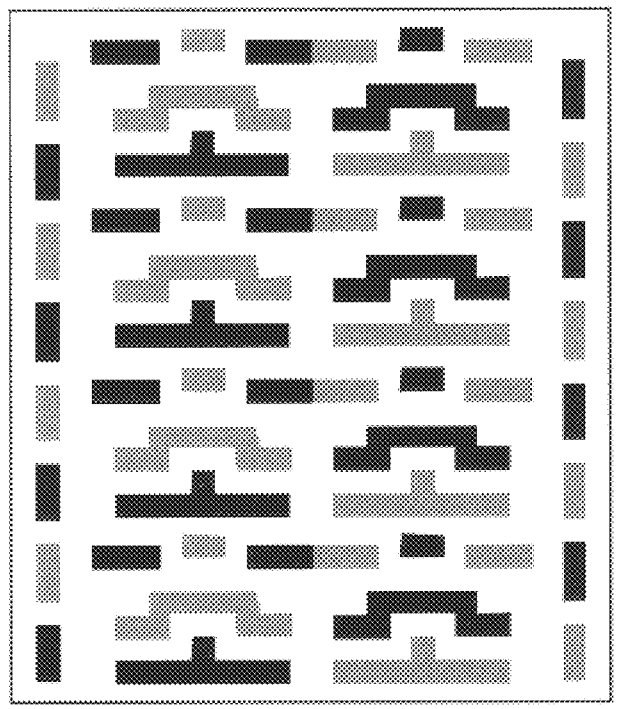
Figure 21:
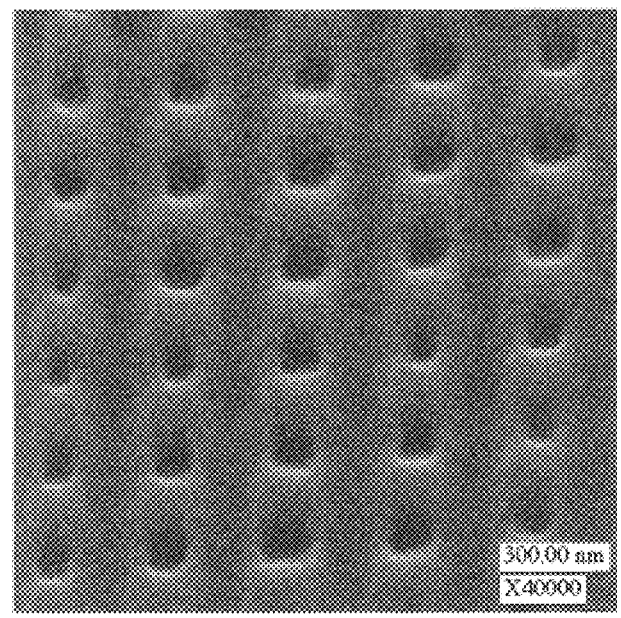

FIG. 11D is an exemplary schematic representation of two preferred embodiments, involving in a first case the mask and wafer aligned substantially normal to the imaging lens optic axis, and in the second case the mask and wafer suitably tilted with respect to the imaging lens optic axis to provide roughly a symmetric illumination of the wafer with the imaging beams from one side and the corresponding reference beam from the other side;

FIG. 11E shows an exemplary optical system used for a 1× magnification reduction to practice;

FIG. 11F shows an exemplary optical system used for a 2× magnification reduction to practice;

FIG. 12A is a schematic representation of an optical system for imaging a sub-mask using a mask of the full pattern along with a prism to bias the frequency components away from low frequency;

FIG. 12B is an alternative embodiment of the schematic representation shown in FIG. 12;

FIG. 13 sets forth schematic examples of VLSI patterns at 0.18 micrometer CD written at a wavelength of 365 nm by a combination of interferometric lithography using the arrangement of FIG. 11, and imaging optical lithography (IIL);

FIGS. 14A–14F show reduction to practice using the aforementioned methods and apparatuses;

FIG. 15 shows an exemplary reduction to practice for an exposure including a 2× optical reduction;

FIG. 6 shows a preferred embodiment for an exemplary reduction to practice optical stepper configuration;

FIG. 17 shows another preferred embodiment for an exemplary reduction to practice optical step configuration;

FIGS. 18A–18D show exemplary periodic IL results approaching the spatial frequency limits of optics. All exposures at I-line. The three ID results were limited by photoresist mechanical properties, not optics;

FIGS. 19A–19C show exemplary micrographs which demonstrate nonlinear spatial period doubling. The left panel shows the original period of 400 nm. The other two micrographs show the result Of doubling spatial frequency by interpolating a second set of lines in-between the original pattern lines. Note the very small linewidth (15 nm) achieved in the right figure. The patterns have been transferred into <110> Si by anisotropic etching;

FIG. 20 shows an exemplary two color separation for a typical SRAM circuit pattern showing the possibilities for using spatial frequency doubling to enhance the pattern density; and, FIG. 21 shows an exemplary array of a 100-nm square via holes printed by a nonlinear double exposure process at I-line.

DETAILED DESCRIPTION OF PREFERRED EXEMPLARY EMBODIMENTS

Before describing the subject invention in detail, a review of Fourier optics is presented. See also, J. W. Goodman, *Introduction to Fourier Optics*, 2nd Ed. (John Wiley Press, NY 1996), the entire contents of which are hereby incorporated herein by this reference.

For simplicity, the ensuing discussion assumes the use of incoherent illumination, so that each Fourier component of the image can be treated and evaluated independently. The discussion will then be extended to the limit of coherent illumination where each component refers to the electric field and the result squared to determine the intensity at the exposure plane. In practice, actual optical lithography tools typically employ partially coherent illumination. For a more detailed discussion of partial coherence, see, for example, J. W. Goodman, *Statistical Optics* (John Wiley, NY 1985). Although the use of partially coherent illumination adds to the computational complexity of the mathematical analysis, it does not otherwise significantly impact the present invention as set forth herein.

An optical lithography system can be separated into an illumination subsystem, a mask, the imaging optical subsystem, and the photoresist optical response. The purpose of the illumination subsystem is to provide uniform illumination of the mask. On passing through the mask, the optical beam is diffracted into a number of plane waves corresponding to the Fourier components of the mask pattern. Each of these plane wave components propagates in a different spatial direction, characterized by the k, and k, components of the wavevector. Mathematically, this is described in the plane of the mask as:

$$f(x, y) = \sum_{k_x} \sum_{k_y} F(k_x, k_y) e^{i2\pi(k_x x + k_y y)} \quad (1)$$

where the summations run over the allowed spatial frequencies, $k_x = n/P_x$; $n=0, \pm 1, \pm 2, \ldots$; $k_y = m/P_y$; $m=0, \pm 1, \pm 2, \ldots$, and $P_x$ and $P_y$ are the repeat periods of the pattern in the x and y directions, respectively. $P_x$ and $P_y$ can be as large as the exposure die size for a non-repeating pattern. Since a chrome-on-glass mask has a binary transmission function (each pixel is either unity or zero), the Fourier transform in (1) is just given by a sum over sin(x)/x functions with appropriate phase shifts corresponding to a decomposition of the desired pattern into rectangles. That is:

$$F(k_x, k_y) = \sum_i a_i b_i \frac{\sin(2\pi k_x a_i/2)}{2\pi k_x a_i/2} \frac{\sin(2\pi k_y b_i/2)}{2\pi k_y b_i/2} e^{i2\pi(k_x c_i + k_y d_i)} \quad (2)$$

where $a_i$ ($b_i$) is the extent of each rectangle in x (y), and $c_i(d_i)$ is the offset of the rectangle center from the coordinate origin in x (y).

Figures 1, 9A:
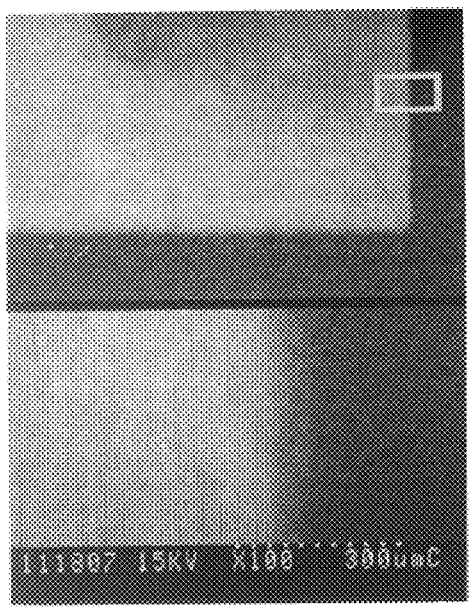
FIGS. 9A and 9B depict, respectively, in-focus and out-of-focus SEM micrographs of the edge regions of a rectangular aperture imaged using the optical system of FIG. 8A.
Figures 2, 9A:
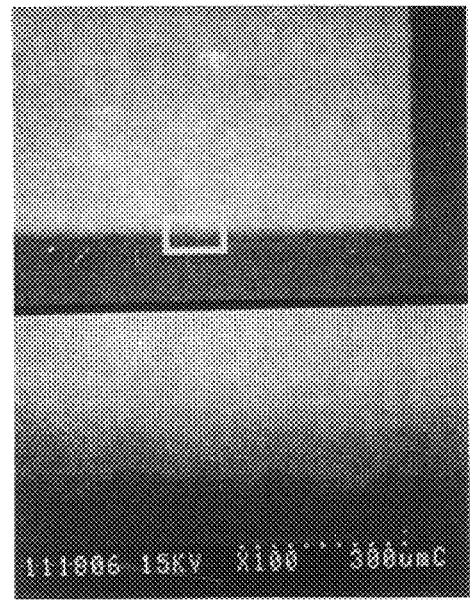
Figures 1, 9B:
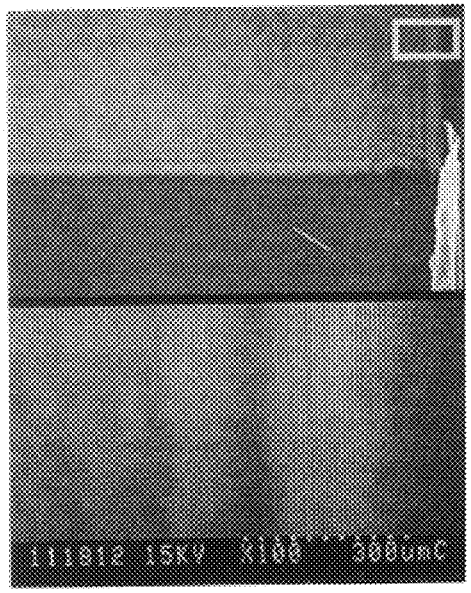
Figures 2, 9B:
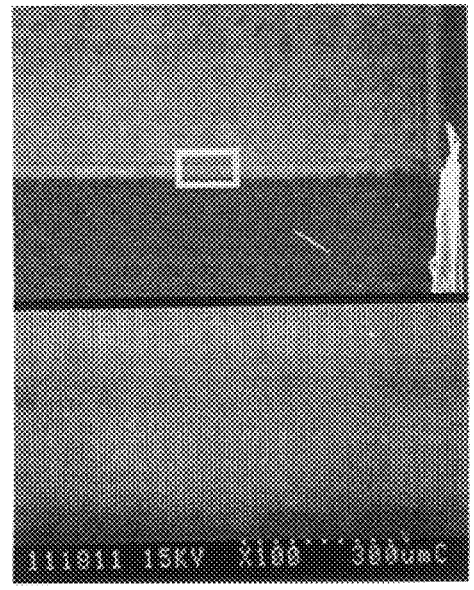

With momentary reference to FIG. 1, the foregoing decomposition of the desired pattern into rectangles is illustrated schematically for a typical VLSI gate structure. In particular, an exemplary pattern, shown in the illustrated embodiment as a typical gate 11, is decomposed into a plurality of rectangles 12–16, shown offset in the Figure for clarity.

The imaging optical subsystem imposes a modulation transfer function (MTF) on the propagation of the Fourier components onto the image (wafer) plane. For diffraction limited optics with circular symmetry, the transfer function is characterized by a spatial frequency, $k_{opt}=NA/\lambda$ where NA is the numerical aperture and $\lambda$ the center wavelength. In the limit of incoherent illumination, the MTF is given by see Goodman, *Introduction to Fourier Optics*, 2nd Ed. (McGraw Hill, NY 1996):

$$T_{incoh}(k_x, k_y) \equiv \quad (3)$$

$$\left\{ \frac{2}{\pi} \left[ \cos^{-1}\left(\frac{k}{2k_{opt}}\right) - \frac{k}{2k_{opt}} \sqrt{1 - \left(\frac{k}{2k_{opt}}\right)^2} \right] \right\} \text{ for } k \le 2k_{opt}$$

where $k=\sqrt{k_x^2+k_y^2}$; and $T_{incoh}(k_x,k_y)=0$ for $k>2k_{opt}$. For a coherent optical system, the transfer function is simply $$T_{coh}(k_x,k_y)=1 \text{ for } k\le k_{opt}, \text{ and } _{coh}(k_x,k_y)=0 \text{ for } k>k_{opt}, \quad (4)$$

where, as noted above, this transfer function is suitably applied to the optical electric fields before evaluating the aerial image intensity.

Figure 1A:
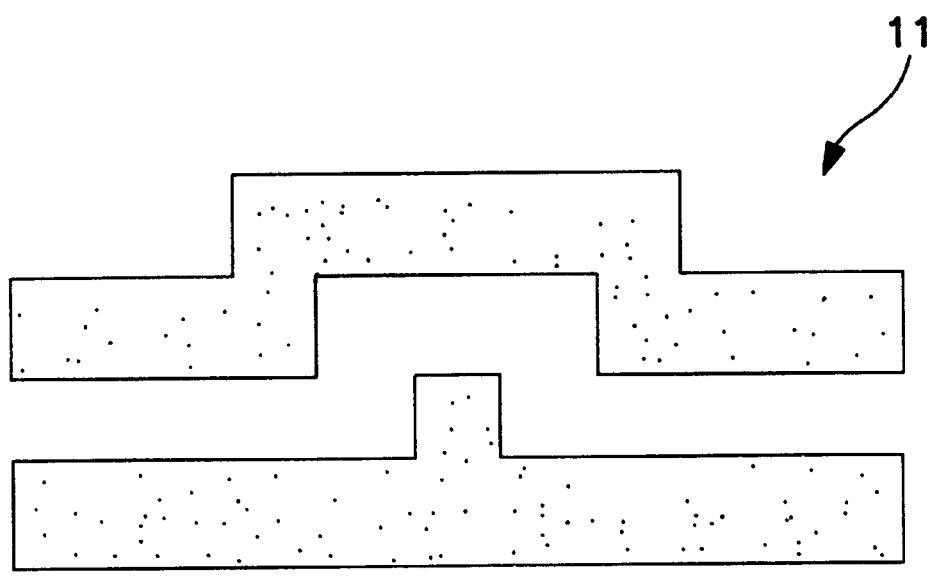
Figure 1B:
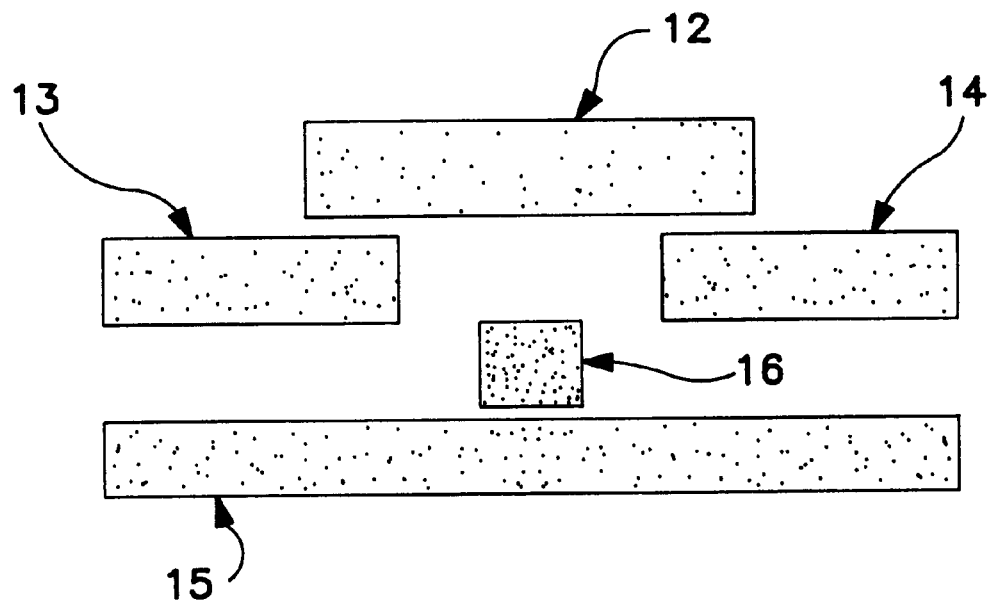
Figure 2:
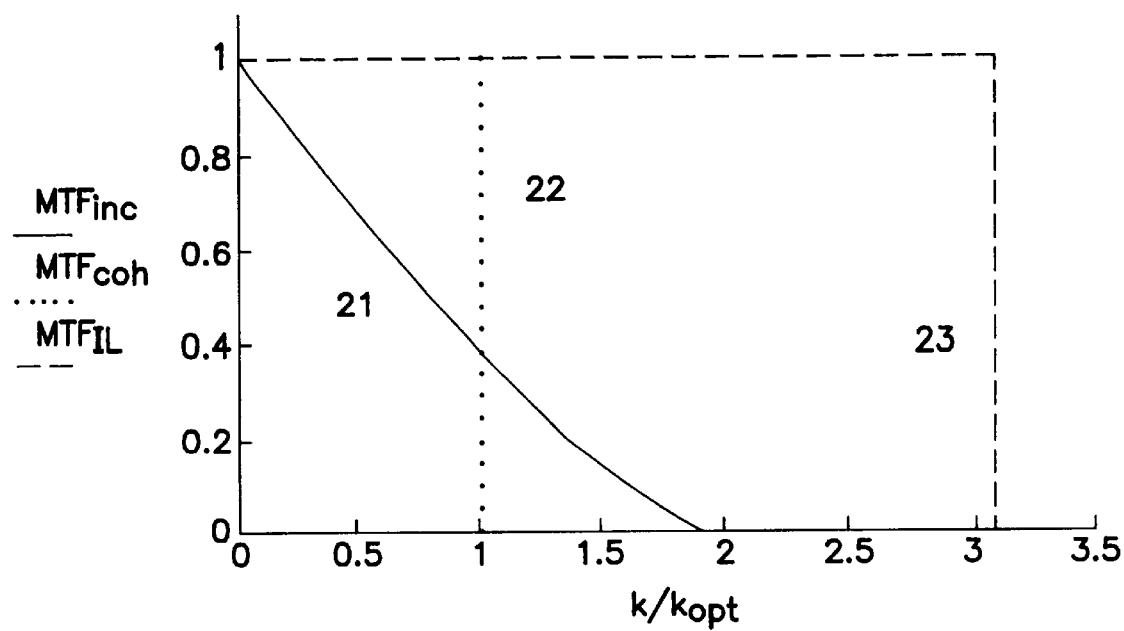

Referring now to FIG. 2, these two transfer functions are shown along with the transfer function for interferometric lithography that will be discussed in more detail below. The scale is set by $k_{opt}=NA/\lambda$ where NA is the optical subsystem numerical aperture and $\lambda$ is the center wavelength of the illumination system. For incoherent illumination 21, the transfer function, $T_{incoh}$, is applied to each Fourier component of the intensity pattern at the mask. For coherent illumination 22, the transfer function, $T_{coh}$, is applied to the Fourier components of the electric field at the mask and the intensity is evaluated at the wafer plane. Also shown is the optical transfer function for interferometric lithography (23) that extends to $2/\lambda$. The parameters used to plot the Figure are $\lambda=365$ nm and NA=0.65. In the graph of FIG. 2, the normalization to $k/k_{opt}$ removes any explicit dependence on $\lambda$.

Finally, the image intensity at the wafer plane is transferred to the resist, which typically exhibits a nonlinear response. In this regard, both positive and negative tone resists are commonly used in the industry. For the sake of definiteness, the calculations presented herein are for negative tone resist (i. e., illuminated regions of the resist are retained on developing, non-illuminated regions are removed). It will be understood that the calculations could equally be made to apply to a positive tone resist with a simple inversion of the mask to reverse the illuminated and non-illuminated regions. For simplicity of calculation, the photoresist response will be approximated as a step function. That is, for local intensities below a threshold value the photoresist is assumed to be fully cleared upon development, while for local intensities above the threshold value, the resist thickness is unaffected by the development process. In practice, the resist has a finite contrast and non-local intensities impact the development. The impact of these realistic considerations is to remove some of the high spatial frequency variations in the results presented below, and to yield finite sidewall slopes rather than the abrupt sidewalls predicted by this simple model. However, these effects do not impact the scope or content of the subject invention.

Figure 3:
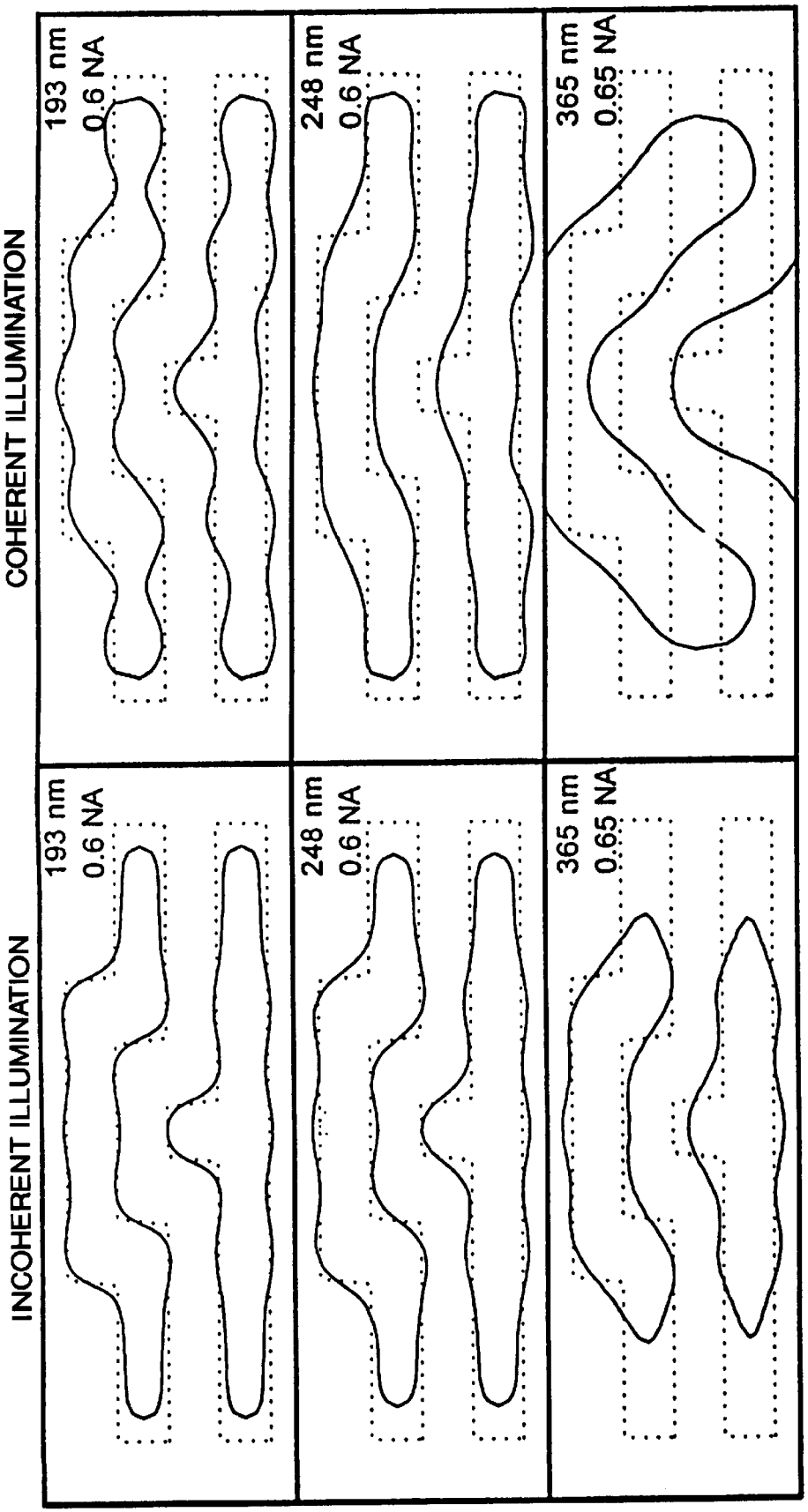

Referring now to FIG. 3, an example of prior art techniques shows the results of applying this known Fourier analysis to the printing of a typical VLSI gate pattern at a 0.18 micrometer CD with optical lithography tools at 365, 248 and 193 =m (bottom to top, respectively). The desired pattern is shown as the dotted lines in each cell. Only the perimeters of the patterns printed by the optical tools are shown. Inside of these perimeters the resist is exposed and remains intact on developing; outside of the perimeters the resist is unexposed and is removed during development (negative resist). As noted above, it is a simple modification to the analysis to reverse this response for positive resist. The patterns are periodic; hence, in an actual exposure, each cell would be repeated many times and, of course, the frames delineating each cell would not be printed. To provide more information in FIG. 3, adjacent cells are shown with the results of different exposure tools and illumination conditions. The NAs were set at 0.65 for the 365 nm (I-line) tool and at 0.6 for the 248 nm (KrF laser source) and 193 nm (ArF laser source). The left column shows the results for incoherent illumination, the right column for coherent illumination. As expected from the simple analysis presented in the background section, an I-line optical lithography tool is not capable of conveniently writing a 0.18 micrometer CD structure (e.g., minimum resolution of ~$k_1\lambda$/NA~0.8×0.365/ 0.65~0.45 micrometer). The printed shapes show severe distortions resulting from the limited frequency components available; indeed, the coherent illumination image is not even two separated features but merges into a single structure. Although not shown in FIG. 3, the patterns are also very sensitive to process variations, showing large changes for small variations in optical exposure levels. The patterns available from a 248 nm optical tool are significantly improved; however, they still show significant rounding of the edges and deviations from the desired structure. Even the patterns available from a 193 nm tool are far from ideal.

The foregoing procedure can be used to parse the lithographic task between optical and interferometric lithographies. This parsing technique is at the heart of the subject invention.

Before illustrating the subject parsing techniques in detail, an evaluation of the MTF for interferometric lithography is first presented.

More particularly, in its simplest form IL uses two coherent optical beams incident on the substrate with equal and opposite azimuthal angles q in a plane normal to the wafer. The intensity at the wafer is given by $$I_{IL}(x)=2I_0[1+\cos(4\pi k \sin(\theta)x+\phi)] \quad (5)$$

where the intensity of each beam individually is $I_0$, $k=1/\lambda$ with $\lambda$ the wavelength of the coherent beam and the phase factor j describes the position of the pattern with respect to the wafer coordinate system. It may be necessary to adjust this phase factor appropriately in multiple exposures (i.e., inter-exposure alignment) in order to form the desired final pattern. This is a MTF of unity, i.e., the intensity goes to zero at the minima. The spatial frequency is given by $$k_x=2k \sin(\theta) \quad (6)$$

and the maximum spatial frequency is $k_x|_{max}=k_{IL}=2/\lambda$. This should be compared with the maximum spatial frequency for an imaging optical system, viz. $k|_{max}=2k_{opt}=2NA/\lambda$. Further, the modulation transfer function for an interferometric exposure is typically unity for all $k<k_{IL}$, in contrast to the sharp drop-off for a traditional optical system. This is illustrated in FIG. 2 along with the corresponding MTFs for both coherent and incoherent illumination optical imaging systems. It is important to remember that the MTF for coherent illumination is applied to the Fourier components of the electric field rather than of the intensity. The nonlinear squaring operation involved in taking the intensity produces frequency components extending out to $2\times k_{opt}$.

Thus a defined procedure for exposing a desired pattern in accordance with the present invention surrounds optical and interferometric lithographies. In accordance with a particularly preferred embodiment, the optical lithography is primarily used to provide the lower frequency components, and the interferometric lithography is primarily used to provide the higher spatial frequency components. Thresholds can be set on the interferometric exposures both in frequency (i.e., a maximum and a minimum spatial frequency) and in amplitude (eliminating any frequency components whose Fourier amplitude is below a preset level). This is illustrated in FIG. 4 for the same VLSI pattern used in the prior art example (FIG. 3).

Figure 4:
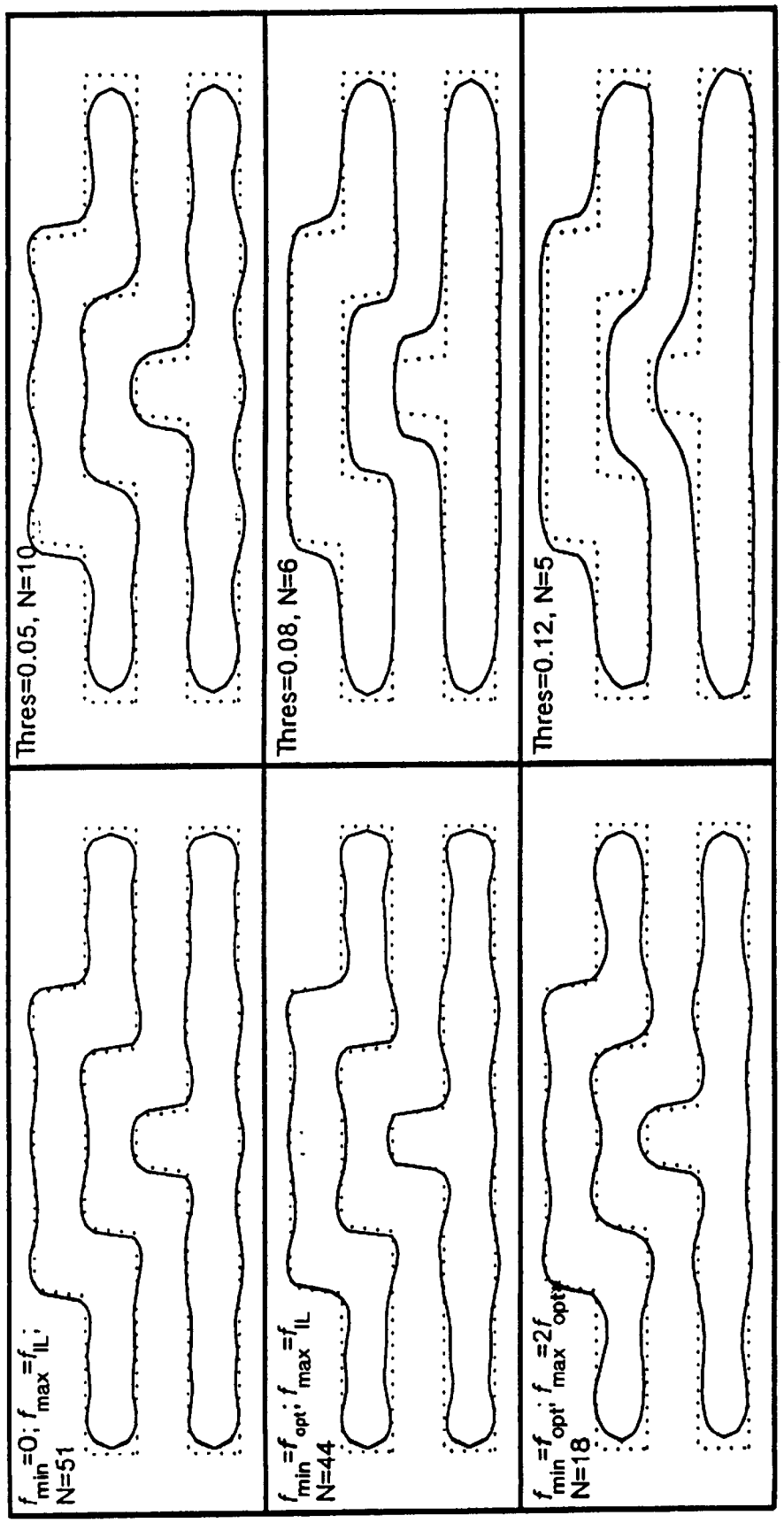

With continued reference to FIG. 4, the left hand column shows examples of setting frequency limits. For the top left panel, the entire frequency space available by interferometric lithography is used and, hence, there is no need for an optical lithography step in this case. The resulting pattern is a closer representation of the desired pattern that any of the prior art examples, even those at substantially shorter wavelengths; however, 51 exposures were required in this example. The lower two panels in the left column show examples of restricting first the low frequencies, and then both low and high frequencies. In each case the low frequency components are derived provided by optical exposure. The right hand column shows the results of setting a threshold on the intensity of interferometric lithography exposures. Progressively higher thresholds (top to bottom) yield progressively fewer interferometric lithography exposures and progressively less ideal approximations to the desired structure. This phenomenon underscores the tradeoff between the number of exposures, which relates to manufacturing cost in terms of exposure time, and the pattern fidelity. This tradeoff may be advantageously optimized within each level's specific context in accordance with the teachings of the present invention.

As noted above, one of the major difficulties facing optical lithography is the increasing complexity of the required masks. Since the parsing procedure outlined herein advantageously exploits optical lithography for the low spatial frequency components of the image and supplies the high spatial frequency components by interferometric lithography, the mask complexity can be dramatically reduced.

Figure 5:
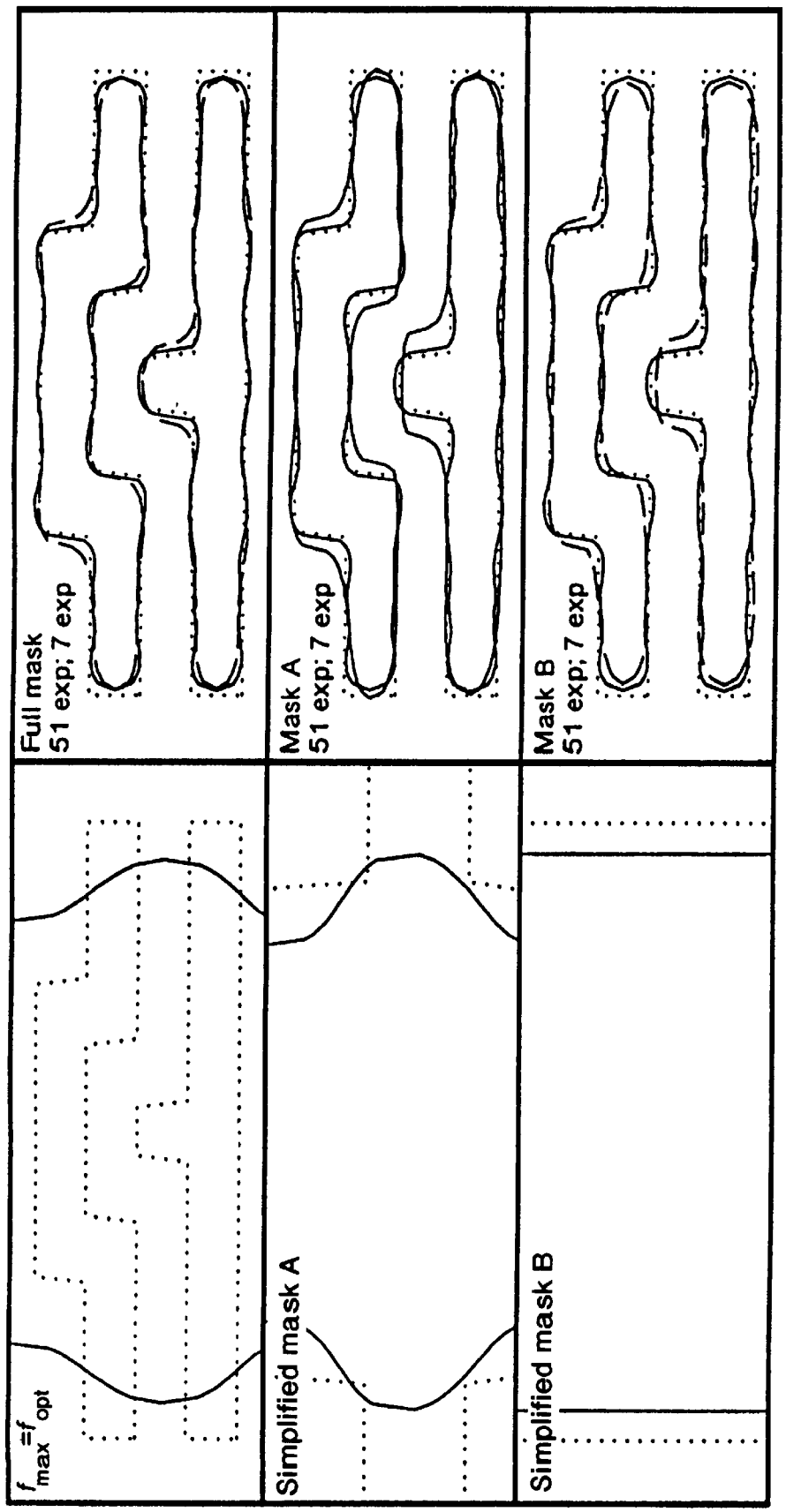

Referring now to FIG. 5, an exemplary VLSI pattern similar that shown in FIG. 4 is again shown using the foregoing paradigm, namely, wherein optical lithography is leveraged for the low spatial frequency components and interferometric lithography is employed for the high spatial frequency components of the mask. More particularly, the top left panel of FIG. shows the image resulting from printing (incoherent imaging) only the low spatial frequency components (up to $k_{opt}=NA/\lambda$) using the full mask structure (shown as the dotted lines). The top right panel shows the results of adding 51 interferometric exposures (solid lines) (see FIG. 4 top left panel) and on restricting the interferometric lithography to only seven exposures with a simple amplitude threshold (dashed lines). These results are substantially equivalent to those shown in FIG. 4. The middle left panel of FIG. 5 shows a much simpler mask (labeled simplified mask A and shown as a dotted line) and the resulting intensity profile when the image from this mask is passed through the imaging system with no restriction on spatial frequency beyond that inherent in the imaging system. This is a much simpler mask than the full pattern, but it produces very similar results within the restricted frequency space of the optical tool. Mask pattern A was derived by simple trial and error from the low frequency results in the panel above by passing the A pattern through the imaging simulation described in the preceding paragraphs. Note that because of the repetitive patterning, pattern A is simply a single rectangular aperture per repetition unit.

With continued reference to FIG. 5, the middle right panel shows the results of using simplified pattern A for the optical exposure and adding interferometric lithography exposures (no threshold, full range of available spatial frequencies) is very close to that for the full mask. The dashed curve is for seven interferometric lithography exposures. The low frequency mask can be simplified even further to the simple straight line segment shown in the bottom left panel. Because of the repetitive pattern, this is just a wide line extending the full height of the die.

The bottom right panel of FIG. 5 shows the results of adding high frequency components using 51 (solid) and 7 (dashed) interferometric lithography exposures. The results are very close to those obtained with the full mask and are again much better than those available even from a 193 nm optical exposure tool. There is very little difference between the resulting exposures showing that a simplified mask can be used for the optical lithography step, easing the mask making difficulty, while still retaining good pattern fidelity. As above, a careful tradeoff between number of exposures (manufacturing throughput) and pattern fidelity needs to be made for individual levels.

It is also possible to reduce the number of interferometric exposures by combining multiple (more than two) beams in a single exposure. A simple example of this is discussed at some length in related U.S. patent application Ser. No. 08/399,381, filed Feb. 24, 1995, by Steven R. J. Brueck, Xiaolan Chen, Saleem Zaidi and Daniel J. Devine, entitled Methods and Apparatuses for *Lithography of Sparse Arrays of Sub-Micrometer Feature*. This earlier application provides a series of techniques for writing a particular two-dimensional exposure, specifically a sparse array (>1:3 hole diameter:interhole distance) of holes in a positive photoresist layer. Specific examples of three, four and five beam exposures are provided therein.

It is often desirable, and often necessary, to delimit the field of an interferometric lithography exposure. Typical die sizes (today on the order of 20×30 mm$^2$) for single exposures are much smaller than wafer sizes (200 mm to 300 mm diameter). In order to obtain a uniform exposure over the die, the optical beam is expanded and transformed into a uniform intensity across the field size. However, the edges of the beam are necessarily nonuniform and if allowed to expose the wafer would result in a substantial pattern nonuniformity. One technique to address this is simply to add a field stop (mask) aperture just above the wafer to delimit the exposed area. A significant problem with this approach, however, surrounds the diffraction effects of the aperture. From diffraction theory, these extend ~10 √l L into the pattern where L is the distance from the field stop to the wafer. For a practical separation distance of L ~1 mm, this diffraction ringing extends ~0.3 mm into the pattern. In many applications, this is an unacceptable result. One technique for eliminating this ringing is to make the edge of the aperture randomly rough on the scale of the wavelength, so that fields scattered from the edge do not add coherently away from the edge.

Another alternative, more in keeping with traditional lithography and providing significantly enhanced flexibility, is to move the field stop away from the wafer and add an optical system that provides two functions simultaneously: 1) image the field stop onto the wafer, and 2) transform the collimated beam incident onto the field stop into a collimated beam at the wafer.

Referring now to FIG. 6, a preferred exemplary embodiment of an optical system used to image a field stop 31 onto a wafer 32 comprises respective lenses 33 and 34 having focal lengths $f_1$ and $f_2$ where the mask 31 is placed a distance $f_1$ before first lens 33, wherein the separation between the lenses is suitably $f_1+f_2$, and the wafer 32 is placed a distanced $f_2$ behind second lens 34. The magnification of the image is given by $-f_2/f_1$. The field stop is suitably disposed before the first lens 33 and illuminated by a laser source that is collimated (i.e., the wavefront has a very large radius of curvature) and approximately uniform across the area of the field stop. In this configuration, the curvature of the wavefront is substantially unaffected by this optical system. The diffraction-limited edge definition of the field stop image at the wafer is suitably proportional to the wavelength and inversely proportional to the numerical aperture of the optical system. This is only one of a class of optical systems that serve to transfer both the mask image and at the same time retain the overall wavefront flatness. The general condition specifying suitable optical systems is that the B and C terms of the overall ABCD ray transfer matrix describing the optical system be zero. (cf. A. Yariv, *Introduction to Optical Electronics* (Holt, Reinhart and Winston, NY 1971), for a discussion of ABCD ray-tracing transfer matrices).

The mathematical description of this imaging system is straightforward in terms of the Fourier optics concepts introduced above. Since the mask illumination is with a coherent uniform beam, a coherent imaging analysis is appropriate. The electric field just after the mask can be written as:

$$E_{mask}(x, y) = \sum_{k_x} \sum_{k_y} M(k_x, k_y) e^{i2\pi k_x x} e^{i2\pi k_y y} \qquad (7)$$

where $M(k_x, k_y)$ is the Fourier transform of the mask transmission function and for convenience is assumed discrete. For an aperiodic mask pattern, the summations over $k_x$, $k_y$ are replaced by integrals in the usual fashion. Passing through the optical system imposes a modulation transfer function:

$$T_{COH}(k_x, k_y) = 1 \text{ for } \sqrt{k_x^2 + k_y^2} < k_{opt} \equiv NA/\lambda \qquad (8)$$
$$= 0 \text{ for } \sqrt{k_x^2 + k_y^2} > k_{opt}$$

where the E subscript is a reminder that this transfer function is applied to the electric field rather than the intensity. Then the electric field at the wafer is given by:

$$E_{mask}(x, y) = \sum_{k_x} \sum_{k_y} M(k_x, k_y) T_{COH}(k_x, k_y) e^{i2\pi k_x x} e^{i2\pi k_y y} \qquad (9)$$

and the intensity is given by $$E_{wafer}(x, y) = |E_{wafer}(x, y)|^2 \qquad (10)$$
$$= \sum_{k_x^*} \sum_{k_x^{**}} \sum_{k_y^*} \sum_{k_y^{**}} M(k_x^*, k_y^*) T_{COH}(k_x^*, k_y^*) M(k_x^{}, k_y^{}) T_{COH}(k_x^{}, k_y^{}) e^{i2\pi(k_x^*+k_x^{**})x} e^{i2\pi(k_y^*+k_y^{**})y}$$
$$= \sum_{k_x^1} \sum_{k_x^1} I(k_x^1, k_y^1) e^{2\pi i k_x^1 x} e^{2\pi i k_y^1 y}$$

where I is the Fourier transform of the intensity, real for a simple transmission mask, and the primes on $k_x'$, and $k_y'$ indicate that, as a result of the squaring operation, they are composed of appropriate sums of the $k_x$ and $k_y$ of the electric field Fourier transform and extend out to $2 \times k_{opt}$.

Figure 7:
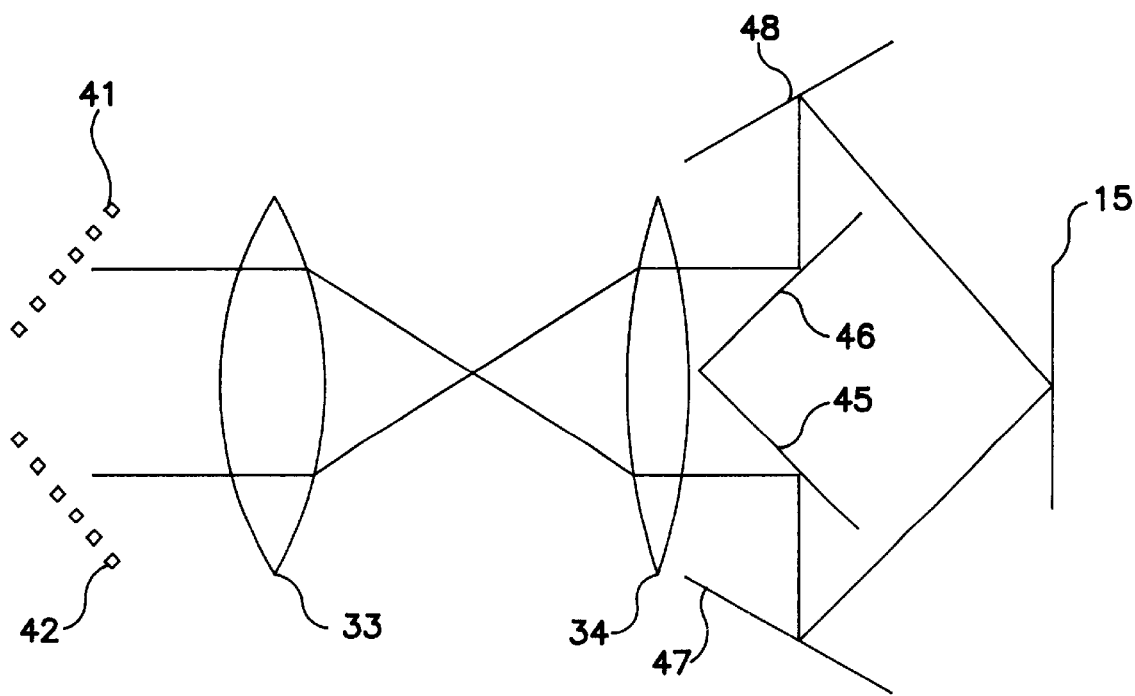
FIG. 7 is a schematic representation of the optical system of FIG. 6, extended to include interferometric lithographic techniques.

The low frequency pattern defined by the mask can be shifted to higher spatial frequencies by splitting the optical path and introducing interferometric optics. Referring now to FIG. 7, a preferred exemplary embodiment of the present invention illustrates the optical system of FIG. 6 extended to include apparatus for integrating interferometric techniques into the lithography system. More particularly, respective masks 41 and 42, which are not necessarily identical, are suitably introduced into two portions (e.g., halves) of the optical beam, shown on the figure as upper and lower. In order to compensate for any tilt introduced into the phase front by the final optical elements, these masks may be advantageously placed at a tilt so that the final image plane is in the plane of the wafer. The optical system consists of lenses 33 and 34 positioned as described in reference to FIG. 6. Finally, interferometric optics are introduced in order to provide the high frequency bias. One skilled in the art will appreciate that the reference beam can enter the system without a mask, so in an alternative embodiment, mask 42 is not necessary and does not exist.

The interferometric optical system shown in FIG. 7 suitably comprises a plurality (e.g., four) of mirrors (45, 46, 47 and 48) that split the optical beam into respective segments (e.g., two) and cause these segments to interfere at the plane of wafer 15. In the illustrated embodiment, the interferometric optical system is suitably configured to bring the mask images onto the wafer at substantially equal and opposite angles to the wafer normal. The advantages of this system include equal center path lengths for the two beams and an absence of induced astigmatism.

Figure 8A:
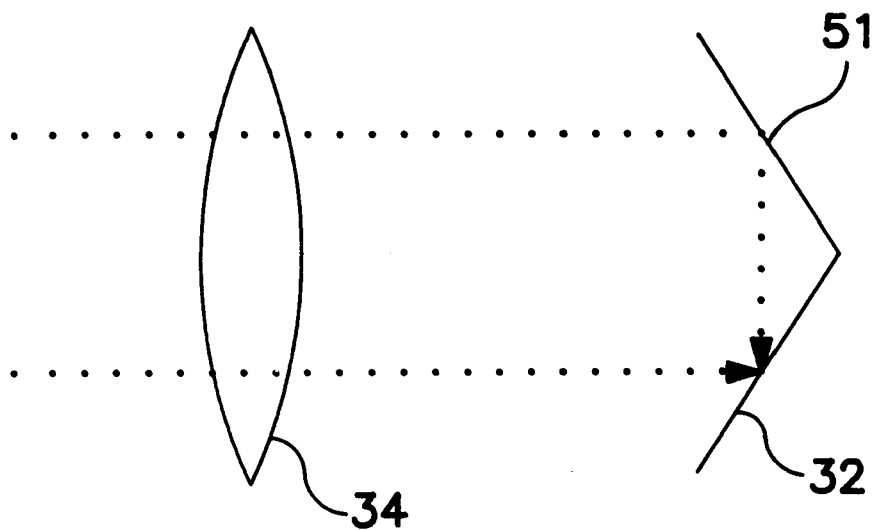
FIGS. 8A and 8B are schematic representations of alternate interferometric optical systems useful in producing mask images biased to high spatial frequencies.
Figure 8B:
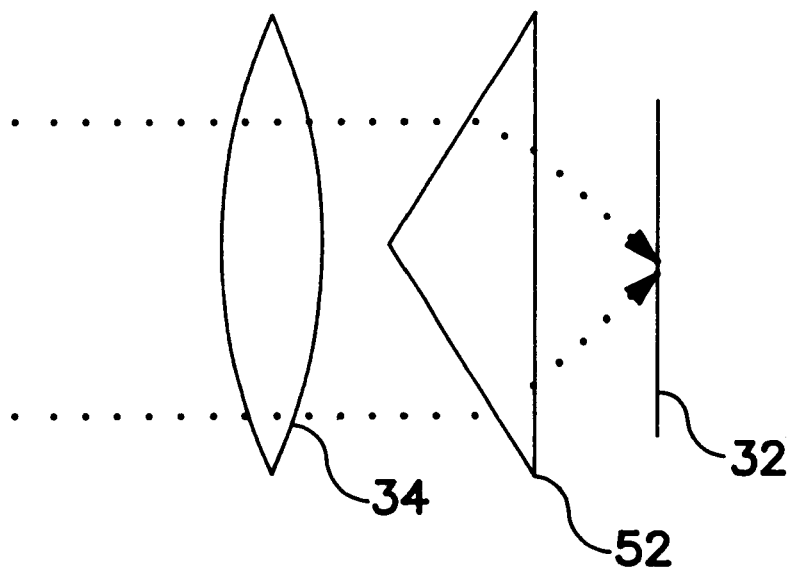

Referring now to FIG. 8, various alternate embodiments may be employed to produce mask images biased to high spatial frequencies. In particular, FIG. 8A employs a simple Fresnel configuration comprising a lens 34 and a mirror 51 configured to apply the mask image to the workpiece (e.g., wafer) 32. Although the configuration of FIG. 8A is attractive in that it is a much simpler configuration involving only one mirror (51), the two center path lengths are unequal, requiring different mask planes for the two masks. FIG. 8B shows a prism (52) configuration, where the center path lengths are equal, but the prism introduces an astigmatism requiring different mask planes for x-lines and y-lines.

The mathematical description of these systems will now be derived in terms of FIG. 7. Small changes that do not affect the essential results are required to adapt this description to the alternate optical schemes of FIG. 8. Adapting Equation 9 to the optical system of FIG. 7 gives:

$$E_{wafer}(x, y) = \left[\sum_{k_x} \sum_{k_y} M_u(k_x, k_y) T_{COH}(k_x, k_y) e^{i2\pi k_x x} e^{i2\pi k_y y}\right] e^{i2\pi w x} + \qquad (11)$$
$$\left[\sum_{k_x} \sum_{k_y} M_l(k_x, k_y) T_{COH}(k_x, k_y) e^{i2\pi k_x x} e^{i2\pi k_y y}\right] e^{-i2\pi w x}$$

where subscripts u, l have been added to the mask Fourier transforms to indicate that they are not necessarily identical; $w = 2\pi \sin \theta / l$ is the spatial frequency bias added to each beam by the interferometric optics. Taking the intensity gives the image printed on the photoresist layer, viz.:

$$I_{wafer}(x, y) = |E_{wafer}(x, y)|^2 \qquad (12)$$

$$= \sum_{k_x^1} \sum_{k_y^1} I_u(k_x^1, k_y^1) e^{i2\pi k_x^1 x} e^{i2\pi k_y^1 y} +$$

$$\sum_{k_x^1} \sum_{k_y^1} I_1(k_x^1, k_y^1) e^{i2\pi k_x^1 x} e^{i2\pi k_y^1 y} +$$

$$2 \sqrt{\sum_{k_x^1} \sum_{k_y^1} I_u(k_x^1, k_y^1) e^{i2\pi k_x^1 x} e^{i2\pi k_y^1 y} \sum_{k_x^1} \sum_{k_y^1} I_1(k_x^1, k_y^1) e^{i2\pi k_x^1 x} e^{i2\pi k_y^1 y} \cos(4\pi wx)}$$

and in the special case that the two masks are identical this reduces to:

$$I_{wafer}(x, y) = 2 \sum_{k_x^1} \sum_{k_y^1} I(k_x^1, k_y^1) e^{i2\pi k_x^1 x} e^{i2\pi k_y^1 y} [1 + \cos(4\pi wx)] \qquad (13)$$

Equation (13) corresponds to the mask image modulated by the high frequency interferometric pattern. For example, if the mask pattern is simply a field stop, then the resulting printed pattern will be a high spatial frequency line:space pattern, delimited at the edges by the field stop. As noted above, the edge of the field stop is typically defined to within a distance of ~λ/NA by the limitations of the optical system. More complex mask patterns are clearly possible; indeed any mask pattern within the spatial frequency limits of the optical system can be reproduced with the additional, high-spatial-frequency modulation introduced by the interferometric optical system in accordance with the present invention.

Referring now to FIG. 9, a plurality of SEM micrographs are presented illustrating an initial experimental demonstration using the optical arrangement of FIG. 8A to print a uniform line:space pattern within a finite field. The optical source was a Ar-ion laser at 364 nm. This was a very low NA optical system (~0.06), using only single-element, uncorrected, spherical lenses, so that the diffraction limited edge definition was only ~6 micrometers and there is probably a significant contribution from lens aberrations. The top two SEMs (FIG. 9A) show the in-focus case. Both the vertical edge of the field stop (parallel to the interferometric grating lines) and the horizontal edge (perpendicular to the interferometric grating lines) are defined to within ~10 micrometers. This edge definition is within a factor of 2 to 3 of the theoretical diffraction limit (λ1/NA~4 micrometers). Notice that the grating period of 0.9 micrometer essentially provides a built-in measuring apparatus. In contrast, the bottom SEMs (FIG. 9B) show similar results for an out-of-focus condition. The intensity fringing at the edges is due to diffraction; the distance to the first fringe of ~30 micrometer can be used to calibrate the distance from the focal plane (i.e., the defocus) at about 3.5 mm.

Equation 13 can be rewritten to emphasize the distribution of spatial frequency contributions associated with this image. viz.:

$$I_{wafer}(x, y) = 2 \sum_{k_x^1} \sum_{k_y^1} I(k_x^1, k_y^1) e^{i2\pi k_x^1 x} e^{i2\pi k_y^1 y} [1 + \cos(4\pi wx)] \qquad (14)$$

$$= 2 \sum_{k_x^1} \sum_{k_y^1} I(k_x^1, k_y^1) e^{i2\pi k_x^1 x} e^{i2\pi k_y^1 y} +$$

$$\sum_{k_x^1} \sum_{k_y^1} I(k_x^1, k_y^1) e^{i2\pi k_x^1 x} e^{i2\pi k_y^1 y} \left[ e^{i2\pi(2w+k_x^1)x} + e^{-i2\pi(2w-k_x^1)x} \right]$$

Figure 10A:
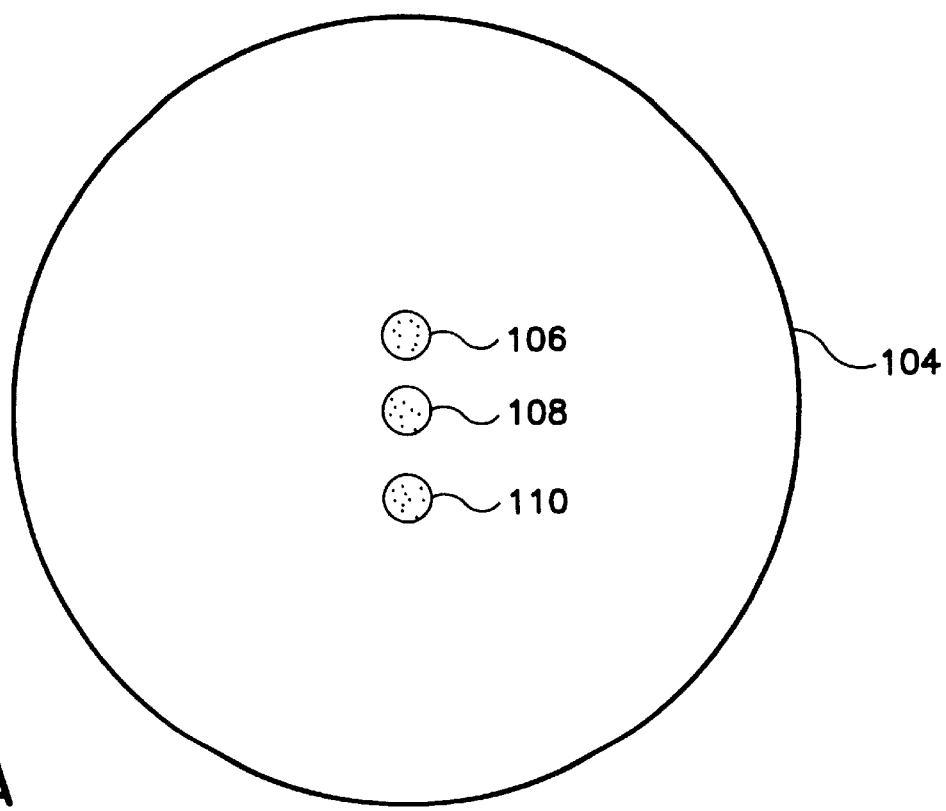
FIGS. 10A and 10B are schematic diagrams representing the spatial frequency space representation of the combination of imaging optical and interferometric exposures.

Close scrutiny of Equation (14) suggests that there are three regions of frequency space with significant frequency content: the low frequency region modified by the lens system and represented by the intensity term, and two replicas of this intensity pattern, one shifted by +2wx and one by −2wx as a result of the interferometric optics. This situation is illustrated in FIG. 10A which suitably models the full extent of frequency space covered by the exposure described in Equation 14 using an exemplary optical system such as that shown in FIG. 8A. In particular, the full extent of available frequency space is modeled as the large circle 104 with radius $k_{IL}=2/\lambda$, with the three filled-in circles 106, 108, and 110 representing the aforementioned three regions of frequency space with significant frequency content. For the optical system used in the demonstration of FIG. 9, the low frequency region is contained within a circle of radius $2k_{opt}=2NA/\lambda$, with NA=0.06, and the two interferometrically created regions are offset by 2w=2 sin(θ)/λ and sin(θ)=0.2 for a 0.9 micrometer pitch grating. The radius of each offset region is equal to that of the low frequency region. From Equation 3, the MTF of the optical system decreases monotonically along a radial direction in each of these frequency regions and is zero at the edges of the circles depicted in FIG. 10A. Note that the lens optical system alone (FIG. 6) is incapable of creating the 0.9 micrometer period grating, whereas the interferometric system combined with the lens system (FIG. 8A) has shifted the frequency content of the image to the higher frequencies necessary to produce the grating while retaining the low frequency content that defines the area of the image. Importantly, the combined optical system results in an image whose frequency content covers continuous regions of frequency space; this should be contrasted to the discussion of periodic structures above in which only points in frequency space, relatively widely separated for the small period pattern (12×CD in x, 5×CD in y) are needed to reproduce the pattern (see, for example, the above discussion of FIGS. 1, 3, 4 and 5).

Figure 10B:
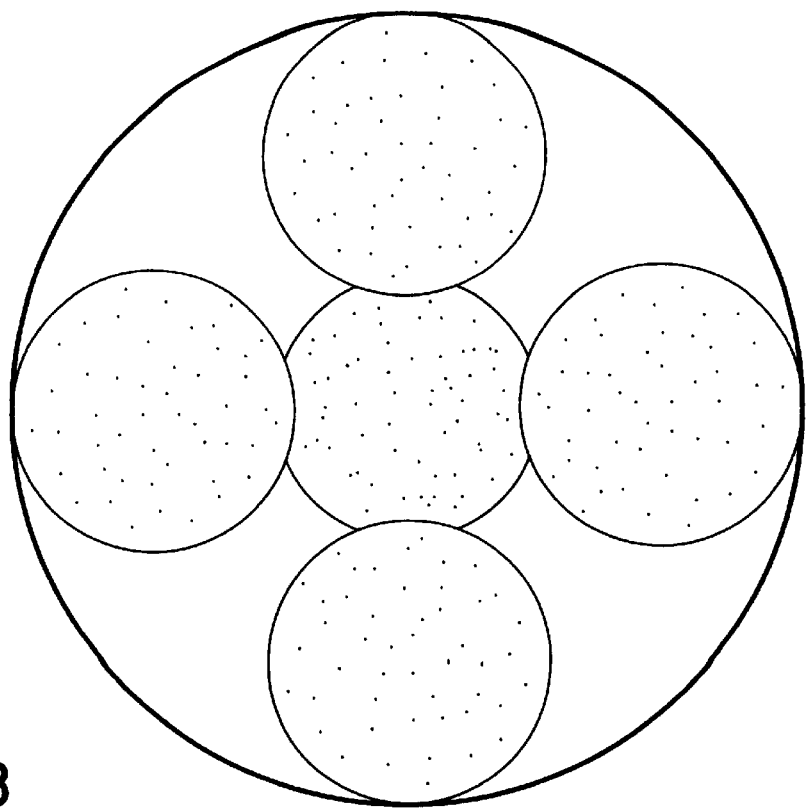

For this first demonstration, a very modest optical system was used. As is clear from FIG. 10A, the resulting pattern covers only a very small region of the available frequency space. FIG. 10B shows the possibility of covering much of spatial frequency space with a small number of exposures and a modest optical system, e.g., for a lens NA of 0.33. Offset regions in frequency space are shown in both the $k_x$- and $k_y$-directions. These could be provided in two exposures using optical systems analogous to those shown in FIGS. 7 and 8, or in a single exposure with a four-beam interferometric system as is discussed for the plane wave case (e.g., single points in frequency space) in U.S. patent application Ser. No. 08/399,381, filed Feb. 24, 1995, by Steven R. J. Brueck, Xiaolan Chen, Saleem Zaidi and Daniel J. Devine, entitled Methods and Apparatuses for *Lithography of Sparse Arrays of Sub-Micrometer Features*. Because the relative phases of the frequency components along the $k_x$- and $k_y$-axes may vary from pattern to pattern, it is likely that two exposures will be required. The NA of λ/3 was chosen since this is the smallest NA for which, along a diameter between three circles, continuous coverage of frequency space is achieved. Since the frequency response of the optical system is inadequate at the edges of the circles, either additional exposures or a larger NA optical system are required to achieve full coverage. Rectilinear patterns have the majority of their frequency content concentrated close to the $k_x$- and $k_y$-axes; so that this frequency space coverage may be satisfactory. If not, additional exposures, or additional beam paths, or both may be employed, as desired.

Even with sufficient exposures at a large enough NA to assure complete coverage of frequency space, this arrangement does not conveniently permit the imaging of arbitrary patterns. This is because each intensity pattern represents a real mask image; this places some constraints on the Fourier components. Specifically, for a simple transmission mask described by Equation 10 the requirement that the intensity after the mask is real and positive requires $$I(k_x,k_y)=I^*(-k_x,-k_y) \tag{15}$$

This same relationship must hold for the final image. However, the interferometric optical system imposes a more constraining relationship, e.g.

$$I(k_x,k_y)=I^*(-k_x,-k_y)=I(k_x+2w,k_y)=I^*(-k_x-2w,-k_y)= \\ I(k_x-2w,k_y)=I^*(-k_2+2w,-k_y) \tag{16}$$

Again, for the final image, the pairwise relationships shown on each line must hold, but the requirement that the relationships hold between these pairs overly constrains the final image.

In accordance with the present invention, there are at least three approaches to reconciling the foregoing constraints: (1) overlap multiple exposures to break this symmetry; (2) use phase masks or other three-dimensional masks to break the overall symmetry described by Equation (15); and (3) modify the optical system by using different masks and optical arrangements in the upper and lower arms to shift the frequency response away from $k_x k_y=0$.

In the most general case, the normal to the wafer is inclined at an angle $\theta_w$ to a first optical system characterized by a magnification $M_1$ and a numerical aperture on the wafer side of $NA_1$ as shown in FIG. 11C. A traditional binary mask with the full pattern is placed in the appropriate position on the opposite side of the optical system. The mask must be tilted by an angle $\theta_m=\tan^{-1}[M_1 \tan(\theta_w)]$ relative to the optical system axis to keep the mask in focus on the wafer. For all polar angles, θ, in this section, the rotation of the wafer and mask are substantially fixed at an angle φ specified relative to the plane defined by the normal to the wafer and the lens optic axis. Coherent illumination is provided incident at an angle $\theta_{ill}$ again within the plane defined by the normal to the wafer and the lens optic axis. The lens captures all of the diffraction components resulting from the mask illumination within a solid angle defined by $NA_1$. As a result of the off-axis illumination, all of the captures frequency components are downshifted in frequency, e.g. at $k_m$–sin $(\theta_{ill})/\lambda$. For $\sin(\theta_{ill})$ larger than $NA_1$, the zero-order diffraction (transmitted beam) is not within the angular acceptance cone of the lens. A second optical system (not shown in FIG. 11C), characterized by a second magnification $M_2$ and angular acceptance $NA_2$, is provided to reintroduced this zero-order beam at the wafer at an angle $\theta_{off}$ relative to the wafer normal. In order not to overfill the die on the wafer, this reference beam includes some imaging information. This information can be derived either from transferring the image with $NA_2$ to the wafer using this second optical system or can be derived from a second mask along with an appropriate second illumination system suitably located in a conjugate image plane to the wafer of the second optical system. In order to maintain interference between these two optical paths, if a second mask and illumination system are used, a common coherent source is used for the two illumination systems and the path lengths from the beamsplitter or other dividing element to the wafer of the two optical systems are maintained to within the coherence length of the source. At the wafer, the final spatial frequency is given by $\{M_1 k_m-[M_1 \sin(\theta_{ill})+\sin(\theta_w)+\sin(\theta_{off})]/\lambda\}$. For most applications, it is desired to print a magnified image of the mask characterized by image frequency components $M_1 k_m$ which imposes the requirement $$[M_1 \sin(\theta_{ill})+\sin(\theta_w)+\sin(\theta_{off})]=0 \tag{17}$$

relating the various angles in FIG. 11C. In some cases, it may be desirable to introduce an offset into the spatial frequencies in which case Eq. 17 is suitably modified.

Two specific cases are probably of the most practical interest. Case (A) is for the wafer normal to the optical axis as shown in FIG. 11D (e.g. $\sin(\theta_w)=0$). Then from Eq. 17, $$\sin(\theta_{off})=-M_1 \sin(\theta_{ill}). \tag{18}$$

In this case the regions of frequency space in the final image produced by this exposure correspond to two circles of radius $NA_1/\lambda$ and offset in the φ direction by $\pm M_1 \sin(\theta_{ill})$. The maximum possible offset is $\sin(\theta_{off}) \to 1$, so the maximum spatial frequency in the image is $(1+NA_1)/\lambda$. This case is related to traditional optical lithography. The mask and wafer are preferably held in the usual positions. This takes advantage of the enormous investment already devoted to producing nearly diffraction-limited, high numerical aperture lenses for this lithographic application. A disadvantage is that the depth-of-field corresponds to that of a lens with the numerical aperture corresponding to $\sin(\theta_{off})$ which is as small as $\lambda/2$ in the extreme case of $\sin(\theta_{off}) \to 1$. Also as described, the system is not telecentric because of the offset illumination of the wafer. Telecentricity can be recovered by adding a duplicating the offset illumination of the mask from the opposite side and adding an additional optical system to provide the corresponding offset illumination of the wafer. The two illuminations would be incoherently related so that ½ the exposure is done with the offset at $+\theta_{ill}$ and the second half at $-\theta_{ill}$ with no additional coherent interference terms.

Case (B) is more symmetric with $\sin(\theta_w) = \sin(\theta_{off})$, then $$\sin(\theta_{off}) = M_1 \sin(\theta_{ill})/2. \tag{19}$$

For this configuration, the maximum spatial frequency is $\{\sin[\sin^{-1}[\sin(\theta_{off})+NA]]+\sin(\theta_{off})\}/\lambda$, which is higher than in the wafer normal case. The covered image frequency space areas are distorted from circles. Some of the advantages of this configuration are: (1) the higher spatial frequency allows printing smaller features; (2) the depth-of-field is increased because of the greater symmetry of the illumination; and (3) the system is closer to telecentric. However, a major disadvantage is the tilt of the wafer away from the surface normal. Current lenses are typically not aberration-corrected for this situation. This is particularly significant for typical magnifications of 4–5× where the requirement on the tilt of the mask is $\tan(\theta_{mask}) = M_1 \tan(\theta_w)$. There are significant trade-offs between all of the possible configurations.

With respect to modifying the optical system by using different masks to reconcile the constraints on the final image, significant practical importance may be obtained by placing only a field stop aperture in one arm, for example the upper arm, and a more complex mask in the lower arm of the interferometric system. Then, Equation 12 can be written:

$$I_{wafer}(x, y) = 1 + \sum_{k_x^1} \sum_{k_y^1} I_1(k_x^1, k_y^1) e^{i2\pi k_x^1 x} e^{i2\pi k_y^1 y} + \tag{20}$$

$$2\sqrt{\sum_{k_x^1} \sum_{k_y^1} I_1(k_x^1, k_y^1) e^{i2\pi k_x^1 x} e^{i2\pi k_y^1 y}} \cos(4\pi w x)$$

$$= 1 + \sum_{k_x^1} \sum_{k_y^1} I_1(k_x^1, k_y^1) e^{i2\pi k_x^1 x} e^{i2\pi k_y^1 y} +$$

$$2 \sum_{k_x} \sum_{k_y} M_1(k_x, k_y) T_E(k_x, k_y) e^{i2\pi k_x x} e^{i2\pi k_y y} \cos(4\pi w x)$$

$$= 1 + \sum_{k_x^1} \sum_{k_y^1} I_1(k_x^1, k_y^1) e^{i2\pi k_x^1 x} e^{i2\pi k_y^1 y} +$$

$$\sum_{k_x} \sum_{k_y} M_1(k_x, k_y) T_E(k_x, k_y) e^{i2\pi k_y y} [e^{i2\pi(2w+k_x)x} + e^{-i2\pi(2w-k_x)x}]$$

Equation 20 was derived under the assumption that the field stop is sufficiently large that the Fourier components associated with $M_u$ are at much smaller frequencies than those included in $M_1$. More particularly, each frequency in the summations in Equation 20 may be replaced by an appropriate function to restrict the pattern to the area defined by the field stop. That is:

$$e^{i2\pi k_x x} e^{i2\pi k_y y} \to \tag{21}$$

$$\int \int e^{i2\pi k_x^1 x} e^{i2\pi k_y^1 y} ab \frac{\sin[2\pi(k_x^1 - k_x)a/2]\sin[2\pi(k_y^1 - k_y)b/2]}{[2\pi(k_x^1 - k_x)a/2] \, [2\pi(k_y^1 - k_y)b/2]}$$

$$T_E(k_x^1 - k_x, k_y^1 - k_y) dk_x^1 dk_y^1$$

where a and b are the linear dimensions of the field stop and use has been made of the equivalence between multiplication and convolution in Fourier transform pairs.

This result still may not fully resolve the constraint issue noted in connection with Equation 16.

In particular, there are constraints on the Fourier coefficients, e.g., $Ml(k_x, k_y) = Ml^*(-k_x, -k_y)$, that are not consistent with an arbitrary final image. As noted above, this can be avoided by shifting the optical system center frequency response away from $|k|=0$. One possible optical scheme that accomplishes this is shown in FIG. 11A.

Referring now to FIG. 11A, effective masks 41 and 42 are employed, with mask 41 suitably comprising a simple open field stop aperture. A prism 71 is suitably disposed behind mask 42 to provide an angular offset of the frequency components. Center optical rays 72 and 73 are shown to provide additional information. Prism 71 may be advantageously chosen such that zero frequency components emerging from mask 42 are directed to the edge of the aperture of lens 33. In this configuration, prism 71 effectively imparts an overall tilt, or bias, we,i,, to the frequency components accepted by the lens system. In the illustrated embodiment, the prism angles are selected to tilt the zero spatial frequency ray emerging from mask 42 so that it just misses the aperture of the first lens (33). Specializing this result to a simple field stop aperture as the upper mask, and again in the approximation that the nonzero Fourier coefficients of this aperture are at much lower frequencies than those of the mask and can initially be neglected, the total field at the mask becomes $$E(x, y) = \tag{22}$$

$$e^{-i2\pi w x} + \sum_{k_x} \sum_{k_y} M_u(k_x, k_y) T_E(k_x - w_{tilt}, k_y) e^{i2\pi(k_x - w_{tilt} + w)x} e^{i2\pi k_y y}$$

and the intensity is $$I(x, y) = |E(x, y)|^2 \qquad (23)$$

$$= 1 + \sum_{k_x}\sum_{k_y} M_1(k_x, k_y)T_E(k_x - w_{tilt}, k_y)e^{i2\pi(k_x - w_{tilt} + 2w)x}e^{i2\pi k_y y} +$$

$$\sum_{k_x}\sum_{k_y} M_1^*(k_x, k_y)T_E(k_x - w_{tilt}, k_y)e^{-i2\pi(k_x - w_{tilt} + 2w)x}e^{i2\pi k_y y} +$$

$$\sum_{k_x}\sum_{k_y}\left[\sum_{k_x^1}\sum_{k_y^1} M_1(k_x, k_y)T_E(k_x - w_{tilt}, k_y)\right.$$

$$\left. M_1^*(k_x^1, k_y^1)T_E(k_x^1 - w_{tilt}, k_y^1)e^{i2\pi(k_x - k_x^1)x}e^{i2\pi(k_y - k_y^1)y}\right]$$

By adjusting $w_{tilt}$ so that, for example, only positive k, are accepted by the lens system, the final constraints on forming an arbitrary image are removed. It should be noted that there are many possible variants to using the prism as illustrated in FIG. 11A. For example, the prism could be placed in front of the mask as in FIG. 11B or the prism could be replaced by an appropriate diffraction grating used either in transmission or in reflection. Moreover, Fourier plane filters could be used (e. g., apertures at the focus of the first lens (33) in the optical system) to select only appropriate subsets of the mask transmission.

Calculations of patterns that can be generated using this idea are shown in FIG. 13. The top panel on the left (labeled All freq.) shows the result of using all reasonably available interferometric exposures. This panel is included for comparison to show the best pattern yet obtained with a large number of exposures and is essentially the same as the top left panel of FIG. 4. The middle left panel shows the results of a double exposure: an imaging interferometric exposure and an incoherently illuminated optical exposure. This middle left panel shows the result of combining a single imaging interferometric lithography (IIL) exposure, offset (biased) in the y- or vertical direction, using the arrangement of FIG. 11A, and a traditional incoherently illuminated optical exposure, both with modest lens NA of 0.4. In the example shown in the middle left panel, the imaging interferometric exposure may be advantageously biased, for example at a y-spatial frequency of 0.5 by prism 71 of FIG. 11A. In accordance with a preferred embodiment, this bias is then effectively canceled out by the interferometric optics (e.g., mirrors 45–48 of FIG. 7) to ultimately yield the proper frequency distribution for the pattern. A mask with the desired pattern is suitably placed in one arm of the optical system, and an open aperture delineating the field is suitably placed in the other arm. For the example shown in FIG. 13, the pattern is repetitive with a period $P_x=12CD$ in the horizontal (x) direction and $P_y=5CD$ in the vertical (y) direction. The Fourier series representation of the pattern has frequency components $k_{n,m}=2\pi(nx/P + my/P)_y$. The corresponding spatial frequencies, normalized to the CD, are $CD/P_x=0.083$ and $CD/P_y=0.2$ and the current practically realizable maximum values of (n, m) supported by interferometric lithography are (11, 5), i. e., $n_{max}=\text{Int}(2P_xCD/\lambda 1)=\text{Int}(P_x k_{IL})$, where the Int function returns the integer portion of the argument. The prism 71 was chosen to tilt all of the frequencies by $w_{tilt}=0.5$. Therefore, the high spatial frequency Fourier components, e.g., m=3, 4 are shifted into the collection cone of the lens 33. The bias, $w_{IL}$, introduced by the interferometric optics, e.g., mirrors 45–48 in FIG. 7, were chosen so that $2w_{IL}=w_{tilt}$ and the offset tilt just cancels the bias added by the interferometric optics.

With continued reference to FIG. 13, the bottom left panel shows a similar calculation for a lens NA of 0.7. Interestingly, while the extreme left and right edges of the pattern are more filled out for the higher NA, the tab at the center of the bottom feature is less well defined at the higher NA. This is largely because this feature requires higher spatial frequency components in the x-direction that are not optimally supplied by either the interferometric or the imaging optical exposure. This may be remedied in the top right panel which shows the results of two imaging interferometric exposures, one biased by the same $w_{tilt}=0.5$ in y and one biased by the same amount in x to provide the spatial frequencies necessary to more satisfactorily define this feature, along with an incoherently illuminated standard optical exposure, all at a lens NA of 0.4. Clearly, the tab is better defined for this exposure. The undulation of the horizontal bars results because the lower frequency components are not present in exactly the correct amplitude and phase. These components arise from each of the imaging interferometric exposures (second term in Equation 22) as well as from the optical exposure. Since most realistic microelectronic patterns will inevitably have small features in both directions, two interferometric exposures are likely to be necessary. The middle right panel shows the result of substituting a single, low frequency interferometric exposure (at a frequency of $\lambda/P_x$) in place of the traditional optical exposure. The result is very similar to the previous panel, but the exposure required is much simpler. Finally, the bottom right panel shows a calculation of the image for two imaging interferometric exposures using a NA=0.7 lens along with a single interferometric exposure at $\lambda/P_x$. This result is almost comparable to the best possible pattern shown on the top left, but requires only three exposures and is compatible with the full complexity of microelectronic processing. These examples serve to illustrate the flexibility permitted by the combination of imaging interferometric and traditional imaging exposures. There are many ways to get to the desired result.

Very importantly, imaging interferometric exposures are not restricted to periodic arrays of structures. This is clearly demonstrated by the earlier example of imaging the non-repetitive field stop. Any arbitrary pattern can be described as a Fourier series, where the repetitive period is the exposure field. For typical ULSI scales, this means that there are a very large number of Fourier components that must be included (e.g., potentially on the order of 100 million). Clearly, this is unrealistic if individual Fourier components are separately exposed; but is not a problem for imaging interferometric exposures which combine the capabilities of imaging optics to deal with large numbers of frequency components and those of interferometry to allow high spatial frequencies.

There are several possibilities for optimization which may be further explored in the context of the present invention. For example, where the total exposure is divided into several sub-exposures, it becomes a straightforward procedure to adjust the relative intensities of these exposures. Further, the imaging interferometric exposures involve two (or perhaps more) optical paths and again it is possible to adjust the intensities of the optical beams in these paths. Additionally, as the last two panels discussed illustrate (FIG. 13), it is sometimes advantageous to adjust the lens NA between the various sub-exposures. That is, the lens NA for the incoherent optical exposure could have been reduced to the point that it only passed the single frequency component used in the simple interferometric exposure. The two beam intensities in the interferometric exposures were taken as equal, and the intensities of each exposure were also equal for all of the imaging exposures. For the simple interferometric exposure (i.e., just two beams only, field-stop apertures in each arm), the intensity was adjusted to provide a very qualitative best fit to the desired pattern.

It remains to specify a procedure for specifying and manufacturing the masks that are needed to define an arbitrary image. Note that this is now a series of sub-masks since different regions of frequency space require different sub-masks to form the complete image. The total number of sub-masks is determined by, inter alia, the spatial frequency content of the image, by the NAs of the optical systems used in the exposure, and by the required image fidelity. The mathematics outlined above yields a functional design apparatus. However, the complexity of real ULSI patterns makes this a difficult task. In principle, the number of spatial frequencies to be reproduced may be as large as the number of pixels in the image, which for a 2×3 cm$^2$ image and a CD of 0.18 micrometer may be as large as 2×10$^{10}$!

Referring now to FIG. 12A, another approach is to use optics to produce the masks from an original mask that completely defines the pattern. A complete pattern mask (81) written by current mask making procedures, for example, electron-beam direct-write patterning without any resolution enhancements such as serifs, helper bars, or phase shifts, is illuminated by incoherent light. Behind the mask is a prism (82) that tilts the exiting wavefronts, similar in function to the prism in FIG. 11A. Alternatively, as in FIG. 11B, prism (82), is placed in front of mask 81. This introduces a bias, $w_{bias}$, in the spatial frequencies imaged by the optical system (lenses 33 and 34). The intensity pattern at the wafer plane is given by:

$$I(x, y) = \sum_{k_x}\sum_{k_y} I(k_x, k_y) MTF_{inc}(k_x - w_{bias}, k_y) e^{i2\pi(k_x - w_{bias})x} e^{i2\pi k_y y} \quad (24)$$

Instead of imaging the wafer, this intensity pattern can be used to expose a mask blank (83) which is subsequently developed and patterned to form a submask. This is precisely the submask that may be advantageously used in the arrangement of FIG. 11 to produce the required Fourier components at the wafer. It is straightforward to show that satisfying the relationship, $$2w = w_{bias} \quad (25)$$

facilitates production of the proper spatial frequencies at the wafer plane.

Experimental results have confirmed this arbitrary pattern capability. While any (nX) reduction exposures are possible with the present invention, both 1× and 2× reduction exposures have been demonstrated. The optical systems used for these experiments are shown in FIG. 11E. For more detail, see "Imaging Interferometric Lithography: Approaching the Resolution Limits of Optics" Optics Letters (Vol. 24, No. 3) Feb. 1, 1999 by Xiaolan Chen and S. R. J. Brueck, which is herein incorporated by reference. Achromatic-doublet lenses (33, 34) with focal lengths of 200- and 100-mm were used. Each optical system provided a (wafer-side) geometrical NA of 0.125. A pupil plane filter (35) provided a nearly diffraction-limited system. For the 1× experiments, a round aperture was used, for the 2× experiments this was replaced with a square aperture restricted the NA to 0.04 (along the x- and y-directions). As the lens physical aperture is larger than the effective imaging aperture, the reference beam was provided through the otherwise unused part of the imaging system NA without any additional optics. Two ~300-$\mu$m diameter holes were provided in the pupil filter to pass the $0^{th}$ order for the offset exposures.

A standard chrome-on-quartz mask (31) with a Manhattan-geometry test pattern with both dense and isolated lines at the CD (five nested 'ells') as well as a large 10×10-CD$^2$ square was used. The field of the reticle (6×6 mm$^2$) was filled with arrays of the test pattern with the mask-side CDS varying from 2- to 12-$\mu$m. Coherent illumination was provided by a single frequency, 364-nm, TEM$_{00}$, Ar-ion laser. The beam was expanded using a 20× UV-objective and collimated by a 500-mm focal-length lens. A silicon wafer (32) with a 250-nm thick photoresist coating (Shipley 510L with 1:1 resist:thinner dilution) was employed. Patterns were developed with Shipley MF CD-26 and inspected optically.

For the 1× experiments, the optical system with a conventional (normal-incidence) coherent exposure was able to print down to CDS of ~6 $\mu$m. Test patterns were investigated with CDS of 2-, 3- and 4-pm. The offset was chosen to put the fundamental frequency of the 2-$\mu$m dense pattern in the center of the lens (e.g. $f_{off} = \frac{1}{4}\mu m^{-1}$).

Exemplary results for a 2-$\mu$m CD pattern are shown in FIGS. 14A–14F. The upper left panel shows an exemplary result of a conventional image (coherent illumination). The small features (corresponding to high spatial frequencies) at the 2-$\mu$m CD are not resolved. The bottom left panel shows exemplary modeling results that are in good agreement with the experiment.

The top middle panel shows the exemplary result of two sequential offset exposures, one in the x-direction (horizontal) and a second in the y-direction (vertical). The high spatial frequency information corresponding to the dense line:space pattern is captured, but the low frequency information (large box) is absent. Again, the modeling results (bottom middle panel) are in good agreement. Note particularly that the corners of the 'ells' are not present in agreement with the experiment.

Finally, the left panels show the full, three-exposure imaging interferometric lithography (IIL) result (experiment-top, model-bottom) that is a principal focus of this application. The full pattern is printed as predicted by the model. These experimental results substantially confirm the modeling results presented above.

A second experimental result substantially confirms the application of this invention to reduction optical systems. A 2× reduction optical system was assembled by changing the second lens (34) to a shorter, 50-mm focal length and adjusting the relative positions appropriately. FIG. 15 shows the experimental results. The bottom row shows the test patterns (after 2× reduction) at wafer-side CDS of 3.5- to 6-$\mu$m printed with a conventional coherent exposure. While some structure is evident in the two smallest patterns, there is insufficient resolution to define the dense line:space features. The 4.5-μm test pattern at the middle of the bottom row is almost resolved. The partially cleared edges of the fine lines are characteristic of a coherent imaging system operated very close to the coherent cutoff limit ($f_{opt}$). While the fundamental frequency of the dense line:space structure is passed by the optical system, the higher frequencies necessary to define the corners and edges are substantially blocked. The right two panels of the bottom row show test patterns at the CDS of 5- and 6-μm resolved by the conventional optical exposure. The top row of FIG. 15 shows the wide range of pattern sizes printed by three-exposure IIL in a single exposure sequence. Test structures down to 2-μm CD are clearly resolved, corresponding to a $\kappa_1$ of 0.22 in the context of the conventional Rayleigh resolution expression. Moreover, the mask-size labels, which are more complex than the test structures, have also been substantially resolved as a result of a continuous frequency space coverage of IIL.

2× reduction IIL has been experimentally demonstrated at the predicted threefold resolution improvement over OL. IIL mask requirements are simply a standard binary mask (Cr-on-quartz). Improvements in resolution are accomplished without adding any mask complexity. In the configuration of FIG. 11E, the maximum offset frequency is $1/\lambda$, and the corresponding maximum spatial frequency is $(1+NA)/\lambda$. Modeling shows that arbitrary patterns at dense CDS of $\lambda/3$ can be achieved (i.e. 130 nm at I-line and 65 nm at a 193-nm exposure wavelength and an NA of 0.65). Multiple laser-source configurations will allow the three IIL exposures to be completed essentially simultaneously with no impact on the manufacturing throughput.

The experiments to date have taken advantage of the geometrical NA of the imaging optical system being larger than the NA used because of aberration issues. In general, aberration issues have been substantially resolved for current manufacturing optical systems and the full NA of the lens is typically used. Thus, it is important to provide a design for an optical system that could be used to extend current manufacturing practice.

In a reduction optical system with the large fields common in today's practice, it will most likely be impractical to extract the zero-order reference beam after the diffraction from the mask as a result of geometrical constraints. Therefore, in the systems disclosed herein, for each offset exposure the optical path from the source includes a beamsplitter before the mask illumination and two optical paths, a first imaging optical path that provides off-axis illumination of the mask and images the diffracted beams corresponding to a high-frequency subset of the mask image onto the wafer die and a second reference optical path that provides the offset reference beam at the wafer die. In order to avoid exposure of adjacent wafer areas, the offset reference beam illumination must contain means for delimiting the exposure area. This could be accomplished in many ways, such as, for example, by locating a field stop just above the wafer or by shifting the field stop away from the wafer and including a second imaging system in the reference optical path to image this field stop onto the wafer die. There are interrelated mechanical and optical difficulties associated with locating the field stop at the wafer. Specifically, the high offset angles imply that the field stop must be very close to the wafer to avoid shadowing. For an offset angle of 75° and a allowable kerf of 20 μm, the height H of the field stop above the wafer must be less than 20/tan(75)~5 μm. There are also Fresnel diffraction effects that arise from the abrupt stop in the intensity that require a similar or even smaller distance from the field stop to the wafer. The imaging solution is most probably preferable and is used in the embodiments described herein.

Specific characteristics that follow from the general description of IIL discussed above include:

A high NA (0.5–0.7) reduction imaging optical system corrected for a particular laser source wavelength. An advantage of a 0.5 NA lens is that spatial frequency overlaps are substantially avoided without the need for pupil plane filters, but at the cost of a reduced maximum frequency capability. The lens must have sufficient working distance to permit offset illumination of the wafer die at an appropriate high angle. The lens must be telecentric on the image side, it is advantageous although not required that it also be telecentric on the mask side.

The illumination system must allow for illumination of the mask for the low spatial frequency exposure. For the most flexibility, a system with an adjustable partial coherence, as is commonly used in today's practice is preferred.

The illumination system for the offset exposures must incorporate a beamsplitter or other beam division means for each offset exposure. The optical paths from the beam splitter through the mask illumination and imaging optics is substantially the same as that from the beam splitter to the offset reference illumination of the wafer die so that the difference in path lengths is within the longitudinal coherence length of the laser source. The two optical paths contain similar materials to compensate for any chromatic dispersion induced by the optical trains.

The mask illumination systems are capable of a minimum of two orthogonal off-axis directions and means must be provided for simultaneous illumination of the die on the wafer with appropriate reference beams. The illumination angle of the mask ($\theta_m$) and the wafer die ($\theta_w$) are related by the condition $\sin \theta_m = M \sin \theta_w$ where M is the imaging optical system reduction. In many applications it will be desirable to provide for four offset illuminations, each separated by 90°.

It is desirable to maintain both the parity and the relative dimensions of the beam from before the beamsplitter onto the wafer for both beams. That is, if the corners of the beamsplitter are labeled ABCD then both the mask and wafer illumination systems are preferably designed to image A onto A, etc. This condition relaxes constraints on the transverse coherence of the laser source to be more in keeping with currently available sources. This condition could be relaxed with a very highly coherent source such as a single-transverse-mode Ar-ion laser. The requirement is that the two paths must provide an a transverse distance within the transverse coherence of the laser source for all points on the wafer die.

A suitable field stop is preferably included in the reference beam path and imaged onto the wafer die to delineate the exposed area and to avoid undesirable Fresnel fringes up to the edge of the die. The NA of the optical system can be substantially less than that of the main imaging optics, but the illumination preferably does not extend beyond the width of the kerf separating multiple exposure dies, generally this involves a resolution of roughly 10–20 μm in today's practice.

Both optical systems from the beamsplitter to the wafer preferably provide matched, interferometric quality optical wavefronts at the wafer. Residual wavefront distortion is directly related to pattern placement accuracy. Requirements depend on the positional accuracy required by the manufacturing application.

The relative optical path lengths for the two optical systems are preferably held fixed to a small fraction of a wavelength in order to provide for registration between the multiple exposures. A control system preferably corrects for any thermal or mechanical drifts, including, for example, air currents associated with positioning of the wafer and cooling of the optical components.

The additional optical components associated with the off-axis and reference illuminations are preferably compatible with all additional functions such as auto-focus and auto alignment that are also required for a manufacturing lithographic solution. In particular, automated wafer and mask changes and alignment functions are preferably possible.

A complex engineering effort is required to assure all of these characteristics with the precision required. Two alternate conceptual designs are presented to illustrate the possible range of solutions. A first preferred embodiment provides for independent optics for each of the off-axis illumination systems. These could be illuminated sequentially from a single laser source with additional optics or multiple laser sources could be used for higher throughput applications. The second preferred embodiment provides for a common offset illumination system that is rotated to provide the multiple offset exposures.

Figure 16:
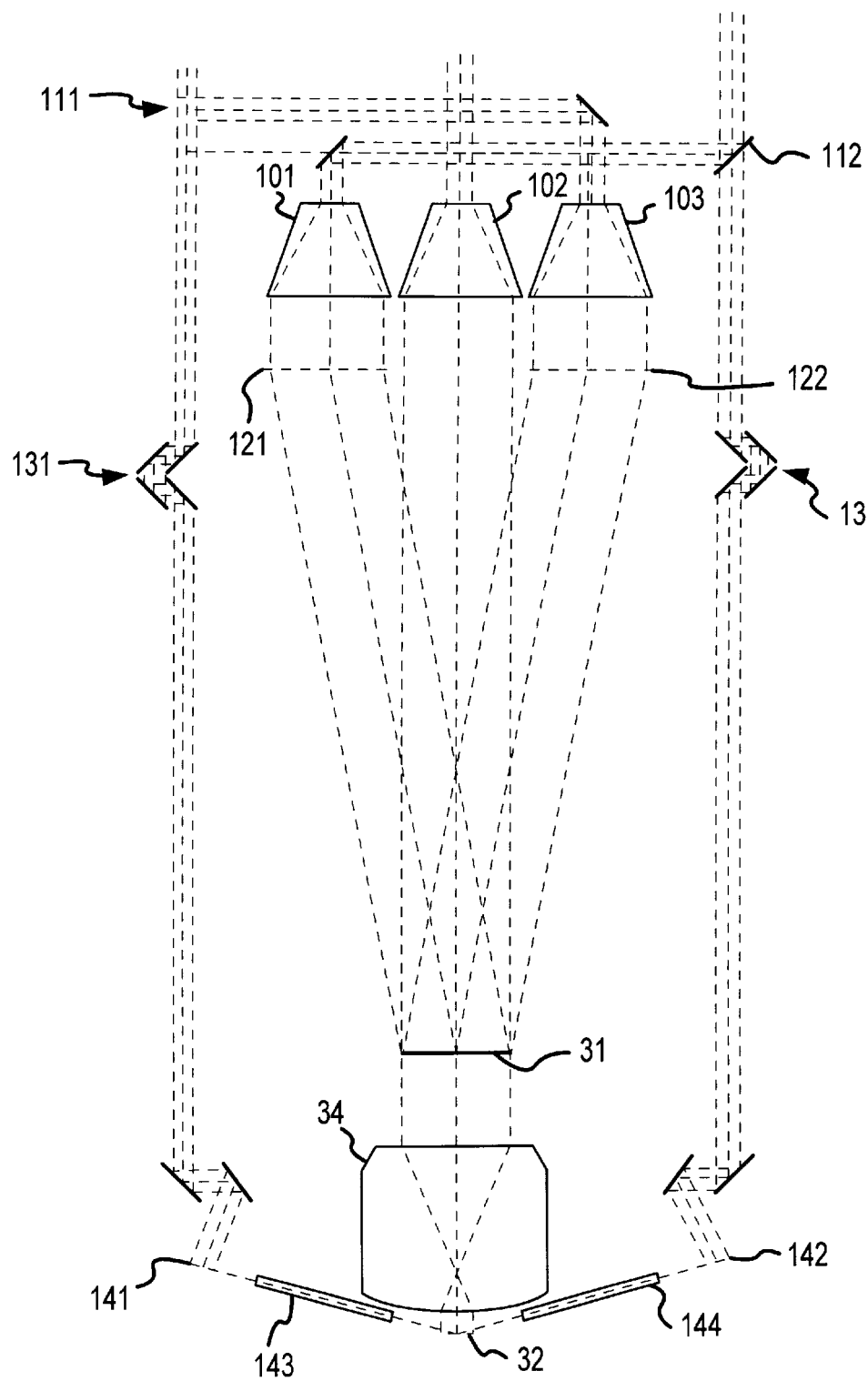

The first preferred embodiment is shown in FIG. 16. For specificity, the figure is drawn for a wafer die offset illumination angle ($\theta_w$) of 75°, a working distance from the imaging lens (34) to the wafer (32) of 2 cm, a 0.5 NA imaging optical system (34, condition 1), and a magnification of 5×. It would be straightforward to modify the design to account for changes in these parameters. The corresponding off-axis illumination angle ($\theta_m$) at the mask (31) is 11.36° (condition 4). Three mask illumination directions: normal incidence on the wafer (condition 2), off-axis at $+\theta_m$ and at $-\theta_m$ are shown along with the corresponding wafer die offset reference illumination systems (condition 4). Two additional off-axis optical systems are in the plane perpendicular to the figure. The solid angles associated with the offset illuminations are quite small allowing the autofocus etc. systems at angles away from the four illumination angles (condition 9). The beam expanders (101, 102, and 103) for the off-axis illumination are moved back from the mask plane sufficiently far to allow all five systems to coexist without requiring any motion between exposures. There is a separate beamsplitter (111, 112) for each off-axis/offset system (condition 3). Gratings (121, 122) are shown for the off-axis illumination required for the high-frequency exposures; there are many alternate means possible including prisms and mirrors. The offset wafer die reference illumination path is physically shorter than that through the imaging lens. An adjustable path length compensator is included in each path (131, 132, condition 3). Suitable glass sections (not shown) can be inserted into the offset path to compensate for dispersion in the offset illumination/imaging path (condition 3). A field stop in each offset wafer illumination path (141, 142) is imaged by suitable optical systems (143, 144) onto the wafer with a small NA~0.05 to delineate the edge of the illuminated region on the wafer die (condition 6). Reflective-grating field stops, with an appropriate period grating of appropriate area to just fill the wafer die, are shown. The grating is used in each offset illumination path to alter the direction of the reference beam to the required offset angle. This also provides the astigmatic demagnification required for the steep off-axis illumination of the wafer die (condition 5). Other solutions are possible, in the second preferred embodiment, discussed below, a cylindrical lens system is used. Both optical paths from the beam splitter to the wafer (off-axis mask illumination and imaging, and offset reference illumination have one image reversal associated with the imaging systems in each path maintaining the parity from the beamsplitter to the wafer (condition 5). The optical quality of both systems must be adequate to satisfy condition 7. Condition 8 requires a feedback loop to maintain the relative interferometric path lengths and hence the pattern registration. The feedback control is either to a mirror or prism driven by a piezoelectric transducer or to an electro-optic crystal. A reference signal to drive this control is established by monitoring the interference between optical signals sampled from the two beam paths. A convenient method to achieve this is to provide one or more gratings on a section of the wafer in the kerf between two wafer dies that is illuminated by both the reference beam and the imaging beams. The period of the grating is chosen to diffract the offset reference beam into the vertical direction back into the lens. Zero-order diffraction (reflection) of the incident imaging beam from this grating area then results in a combination of the two beams into a single beam. The interference between these two beams can be monitored either above the mask or on transmission through the reflective-grating field stops where there is more room available than on the wafer side. Alternatively, it is possible to provide a beam combiner rigidly attached to the bottom of the lens optical system to allow monitoring of the path length difference without requiring that a wafer be in place. If the path length difference was controlled with a reference independent of the wafer, then a the interference of the imaging and reference beams off of a suitable grating mark on the wafer could be used for wafer alignment or focus control.

FIG. 17 shows an elementary sketch of exemplary IIL equipment and its key elements for practicing IIL. The additional optical and mechanical elements are incorporated into a conventional lithographic projector composed of a mask aligner and changer, image forming lens, wafer table and loading/unloading devices, environmental chamber etc. However the illuminating system is different from the usual stepper. The description of the key additional elements to the stepper is contained in the following paragraphs.

The image of the mask 201 is projected by lens 202 onto the wafer plane 103. The laser beam is suitably expanded and formed to illuminate the entire mask or a segment of it. The expanded laser beam is divided by the beam splitter 205 and directed onto the mirror 206. For the low frequency exposure the mirror is in the position drawn with continuous lines. The beam is then reflected perpendicularly to the mask. The shutter 216 is closed.

To increase the effective Numerical Aperture (NA) and thus the resolution of the lens 202 the diffracted spectra of the mask must interfere with the oblique beam 215, the reference beam.

To obliquely illuminate the mask the turning mirror 206 is pivoted into the position 206A about a line perpendicular to the drawing plane. The dashed lines indicate the new path of the image forming beam which now will transfer the high frequencies. The optical path is increased and it must be compensated in the reference beam path. The high frequency exposure is accomplished by opening the laser shutter (not shown) and simultaneously opening the shutter 216.

The path of the reference beam is quite complex. It preferably insures that the path from the beam splitter to the wafer plane is the same as the path from the beam splitter through the image forming arm. It also preferably has substantially the same dispersion and the same orientation. Let us assume that the reduction ratio is M and the incidence angle of the reference beam is $\theta_{off}$. (On the drawing the reduction was assumed 3× and the angle $\theta_{off}$–75°. The reference beam diameter is preferably reduced first to the diagonal of the image being exposed. This is accomplished by the lens means 208. In addition these lens means contain an optical element 209, which may be concentric with the converging beam. Its thickness equalizes the dispersive light path in the image forming lens with that of the reference beam. This compensation considerably increases the potential spectral range of the laser source. The beam contractor here is in the form of a Gallilean telescope. The subsequent optical elements 210 are used to compress the beam in the direction parallel to the axis of both arms. The compression ratio is equal to $\sin(90°-\theta_{off})$. If the image forming lens were capable of forming an image at $\sin(\theta_{off})$=NA, then it would form an exposing beam of the same crossection. For this purpose the lens elements 210 are of cylindrical form. The crossection of the beam in the direction perpendicular to the drawing is left unaltered. Here the beam shaper has two positive elements with a focal plane in between. This compensates for the reflection of the reference beam by the turning mirror 212. The two right angle prisms 211 are used for compensation of the optical path in air. (In IIL equipment the image forming path in air is usually longer than in the image forming arm). In addition they are used to servo dynamically the phase of the reference beam to coincide with the phase of the image forming beam. In one embodiment, the servo may be accomplished by the conventional piezo-electric actuators. Finally the unit power telescope 214 inverts the image of the field stop 213 and projects it onto the chip kerf. The fundamental property of this telescope is its telecentricity on the image and object side. It also may be called a "Fourier Transform Lens".

The entire reference optical train is of the substantially same optical quality as the image forming optics. However it must be corrected for the axial spherical aberration. It also must be reasonably free of coma in order to obey the Abbe sin condition. The latter characteristic is a function of amplitude uniformity and spatial coherence. The unit power telescope in the ideal case should have a flat field. In practice a blur circle will just slightly enlarge the kerf of the chip. The reference beam optics in other words should be aplanatic and does not require the same angular field coverage as the imaging lens 202.

The optical system described above is capable of exposing lines in direction perpendicular to the plane of the drawing, in essence for the exposure of lines in the plane of the drawing elements 205–214 preferably rotate about the axis of the lens 202 into at least one position eccentric at 90° to the first exposure—Should a better, and more "telecentric" exposure be desired the reference beam optics are preferably rotated by additional 90° and 180° to cover the two directions equally Finally an IIL exposure system preferably guarantees that the image forming wavefront and the reference wavefront converge in the final image plane in the same phase. This may be accomplished in several ways. The principal idea is to use the interference between the two wavefronts for this purpose. One system may employ a very small grating in the chip kerf. This grating has such a period that the first order of the incoming beam is reflected into the lens. A suitable grating is also on the mask. This grating again sends down the first order beam, which is partially reflected back and partially diffracted by the grating, Now the beam originating at the mask plane and the one from the reference beam have the same optical path. A beam splitter 217 behind the mask defects the fringe pattern and therefore the phase information. The phase is preferably kept constant through the feedback to the piezo actuators operating on prism 211. There are other solutions to the detection of the feedback signal. One can use the first order reflected by the wafer from the mask illumination and use an adjacent portion of the wafer kerf for the reflected portion of the reference beam. A simple compensated interferometer brings both beams together and the phase is readily detected. To obtain the best results at least two phase detectors are preferably incorporated for each direction of exposure.

The present invention can also be used to apply nonlinearities to structures. Extending spatial frequencies is disclosed in more detail in U.S. patent application Ser. No. 08/932,428 entitled "Method and Apparatus for Extending Spatial Frequencies in Photolithography Images" with inventors Steven R. J. Brueck and Saleem H. Zaidi filed on Sep. 17, 1997, which is hereby incorporated by reference. In a preferred embodiment, nonlinearities extend optics beyond the linear systems limit. Higher spatial frequencies are preferably accessed by taking advantage of nonlinearities both in processing and in temporal response (multi-photon absorption). When the periodic IL results approach the spatial frequency limits of optics (FIGS. 18A–18D), the photoresist response leads to vertical sidewalls while the Fourier transforms of these structures contain frequencies well above the fundamental spatial frequency of the sinusoidal IL aerial image.

The linear systems constraints apply to pattern frequencies, not to linewidths. This is dramatically illustrated by the second micrograph in FIG. 18 that shows a 50-nm CD line on a 2-em pitch, namely a line:space ratio of 1:20. The very high spatial frequencies corresponding to this narrow line are the result of photoresist process nonlinearities and the exposure aerial image was a 2-$\mu$m period sine wave. Importantly, the process latitude for printing this fine line was much greater than that for printing the 150-nm dense line:space pattern. This is a general result, it is always more difficult to print 1:1 patterns since these occur very near the threshold dose for developing all the way through the resist. Larger line:space ratios are nearer saturation where the process is very forgiving of small dose variations and the nonlinearities (vertical sidewalls) are larger. It is easier (greater process latitude) to print smaller CD structures at a fixed pitch.

In a preferred embodiment, a simple technique for enhancing the resolution is simply to image ½ of the pattern (every other structure) at an easy line:space ratio and then, in a second exposure (with some intermediate processing), suitably interpolate the missing structures. For simplicity, the technique will first be illustrated in terms of IL (periodic patterns), then the extension to arbitrary patterns using IIL will be presented. A grating at a period p with a linewidth of 0.75 p and a space of 0.25 p using a negative resist is printed. This pattern is then suitably transferred into an underlying nitride layer. An identical grating, offset by ½ the period, is patterned in a second resist layer and the pattern is again transferred into the nitride layer. The resulting pattern is a 1:1 line:space grating at p/2. FIG. 19 shows exemplary results of this process where the patterns were further transferred into <110> Si by suitable anisotropic chemical etching.

FIG. 20 shows how this frequency doubling technique might be applied to a circuit pattern, in this case, for example, a typical SRAM pattern. The two colors preferably indicate the patterns written in each exposure. No two features of the same color approach each other by less than about 1.5CD. The spacing is less than 2 CD because of the staggered features in the SRAM pattern, but changing the design to a CD grid allows a straightforward doubling of the pattern density.

Another example of the use of nonlinear processes to provide useful structures is, in this case, an exemplary dense array of square via holes at a 100-nm CD exposed at I-line in a single resist level using two separate exposure/develop cycles without any additional etch or deposition process steps, as shown in FIG. 21. The frequencies necessary to define the sharp corners extend well beyond the linear systems limit of optics.

The following discusses modeling and experimental verification for process nonlinearity, wherein the processes are attractive for extending lithography to deep subwavelength scales. In particular, photoresist processes, including top-surface imaging, does not involve any additional etch/deposition steps as, for example, the multiple exposure/develop process illustrated in FIG. 21. In an alternative embodiment, multiple resist layers is also used. Mathematically, the period doubling of FIGS. 19A–19C is the sum of two exposure processes, each with separate nonlinear operators (to turn the $[1+\cos(2\pi x/p)]$ aerial images into sums of integral higher harmonic sine functions). Similarly the square vias of FIG. 21 are described by a product of the exposures with separate nonlinearities. The spatial frequency analysis for IIL is also a powerful approach to understanding the possibilities of nonlinear processes to further extend optical lithography.

The coloring problem of FIG. 20 is clearly related to mathematical topology problems. Signal processing preferably develops suitable general theorems of the number of colors required for arbitrary patterns and the characteristics of patterns that minimize the number of required colors.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention.

What is claimed is:

1. A process for producing a two-dimensional spatial pattern in a photosensitive material on a substrate comprising the steps of:
    effecting a first exposure of said photosensitive material using a first optical arrangement including a first illumination system for providing illumination of a first mask characterized by a first mask pattern and a first imaging system for imaging said first mask pattern onto said photosensitive material on said substrate, said first exposure having a first intensity pattern;
    effecting a second exposure of said photosensitive material using a second optical arrangement, said second exposure having a second intensity pattern;
    wherein each of said first and second intensity patterns, which provide first and second subsets of the spatial frequencies of said two-dimensional spatial pattern, are combined to define said two dimensional spatial pattern in said photosensitive material; and,
    processing said photosensitive material to instantiate said two-dimensional spatial pattern.

2. The process of claim 1 wherein said photosensitive material is a photoresist layer.

3. The process of claim 1 wherein said substrate is a wafer.

4. The process of claim 1 wherein said processing results in a physical change in said photosensitive material such that said photosensitive material acts as a mask for modifying appropriate properties of said substrate according to said two-dimensional spatial pattern.

5. The process of claim 1 wherein said second optical arrangement includes a second illumination system for providing illumination of a second mask characterized by a second mask pattern and a second imaging system for imaging said second mask pattern onto said photosensitive material on said substrate.

6. The process of claim 5 wherein said second optical arrangement further includes a third illumination system for providing illumination of a third mask characterized by a third mask pattern and a third imaging system for imaging said third mask pattern such that electric fields corresponding to said second mask pattern and said third mask pattern coherently interfere to provide an intensity pattern on said photosensitive material on said substrate.

7. The process of claim 6, wherein said third mask is substantially identical to said second mask.

8. The process of claim 1 wherein said first and second exposure steps are performed sequentially in time.

9. The process of claim 1 wherein said combining step includes the process of substantially simultaneously adding said first and second intensity patterns of said exposures using illumination sources with orthogonal polarizations.

10. The process of claim 1 wherein said combining step includes the process of substantially simultaneously adding said first and second intensity patterns of said exposures using mutually incoherent illumination sources.

11. The process of claim 1 wherein said step of effecting a first exposure includes the process of exposing, using a first optical lithographic exposure system having an illumination source at a first wavelength $\lambda_1$ and characterized by a first numerical aperture $NA_1$, to provide lower spatial frequency components of said two-dimensional spatial pattern to said photosensitive material, wherein the magnitudes of the spatial frequencies of said lower spatial frequency components are less than approximately $NA_1/\lambda_1$.

12. The process of claim 1 wherein said second exposure includes the process of exposing, using multiple-beam interferometric exposures having an illumination source at a first wavelength $\lambda_1$ and characterized by a first numerical aperture $NA_1$, to provide higher spatial frequency components of said two-dimensional spatial pattern to said photosensitive material, wherein the magnitudes of the spatial frequencies of said higher spatial frequency components are greater than approximately $NA_1/\lambda_1$, wherein said second exposure is characterized by:
    an intensity pattern at said substrate with a spatial frequency established by the angles of incidence of said multiple beams onto said photosensitive material on said substrate,
    an amplitude of said intensity pattern in said photosensitive material established by an exposure dose used in said second exposure, and
    a phase of said intensity pattern relative to a reference on said substrate.

13. The process of claim 1 wherein said second exposure includes the process of exposing, using imaging-interferometric exposures having an illumination source at a first wavelength $\lambda_1$, and characterized by a first numerical aperture $NA_1$, to provide the higher spatial frequency components of said two-dimensional spatial pattern to said photosensitive material, wherein the magnitudes of the spatial frequencies of said higher spatial frequency components are greater than approximately $NA_1/\lambda_1$, wherein said second exposure is characterized by
    a central spatial frequency component at a central spatial frequency;
    an amplitude of said central spatial frequency component established by an exposure dose used in said second exposure;

a phase of said central spatial frequency component;

a range of said higher spatial frequency components with spatial frequencies within at least a portion of a circle centered on said central spatial frequency having amplitudes and phases adjusted so as to define said two-dimensional spatial pattern in said photosensitive material on said substrate.

14. The process of claim 13 wherein said imaging-interferometric exposure is created by an imaging-interferometric optical system comprising:

a spatially coherent illumination source at a wavelength $\lambda_2$;

a second optical imaging system with numerical aperture $NA_2$ and magnification $M_2$;

means for mounting a second mask at polar angles $(-\arc \sin[M_2 \sin(\theta_2)], \phi_2)$ relative to a coordinate system fixed to said second imaging optical system;

optical means for illuminating said second mask with substantially a uniform plane wave at polar angles $(-\arc \sin[\sin(\theta_3)/M_2], \phi_2)$ relative to said coordinate system;

means for mounting substrate at polar angles $(\theta_2, \phi_2)$ relative to said coordinate system;

optical means for directing a reference plane wave through a third mask to delimit the areas of exposure on said substrate and imaging said third mask onto said substrate with the zero-order spatial frequency of said imaging incident on said substrate at the polar angles $(\theta_3, \phi_2)$ relative to said coordinate system coherently with the optical fields resulting from said illumination of said second mask and said second optical imaging system;

alignment means for adjusting substrate position or relative optical path lengths to ensure proper phase relationship between frequency components of said first and said second exposures;

resulting in said second exposure on said substrate characterized by:

two offset center spatial frequencies at $+[\sin(\theta_2)+\sin(\theta_3-\theta_2)]/\lambda_2$ and $-[\sin(\theta_2)+\sin(\theta_3-\theta_2)]/\lambda_2$ along the direction described by $\phi_2$;

spatial frequency components within at least said portions of circles of radius $NA_2/\lambda_2$ in spatial frequency space centered at each of said offset center spatial frequency; wherein relative amplitudes and phases of spatial frequency components within at least a portion of said circles substantially reproduce those of desired pattern on said substrate.

15. The process of claim 14 wherein said angle $\theta_2$ is fixed at $\theta_3/2$ thereby resulting in a symmetrical illumination of said photosensitive material on said substrate wherein centerline of said second optical imaging system is at an angle of $-\theta_3/2$ to said substrate and centerline of said imaging optical means is at an angle of $+\theta_3/2$ to said substrate and further said center spatial frequencies are respectively $+2 \sin(\theta_3/2)/\lambda_2$ and $-2 \sin(\theta_3/2)/\lambda_2$ along the direction described by $\phi_2$.

16. The process of claim 14 wherein said angle $\theta_2$ is fixed at 0 thereby said second mask and said substrate are perpendicular to centerline of said second optical imaging system and further said center spatial frequencies are respectively $+\sin(\theta_3)/\lambda_2$ and $-\sin(\theta_3)/\lambda_2$ along the direction described by $\phi_2$.

17. The process of claim 13 wherein said imaging-interferometric exposure is created by a imaging interferometric optical system comprising:

a partially spatially coherent illumination source at a wavelength $\lambda_2$ with a coherence $\sigma_2$;

a second optical imaging system with numerical aperture $NA_2$ and magnification $M_2$;

means for mounting a second mask at polar angles $(-\arc \sin[M_2 \sin(\theta_2)], \phi_2)$ relative to a coordinate system fixed to said second imaging optical system;

optical means for illuminating said second mask at polar angles centered about $(-\arc \sin[\sin(\theta_3)/M_2], \phi_2)$ relative to said coordinate system;

means for mounting substrate at polar angles $(\theta_2, \phi_2)$ relative to said coordinate system;

optical means for directing a reference wave through a third mask to delimit the areas of exposure on said substrate and imaging said third mask onto said substrate with the zero-order spatial frequency of said imaging incident on said substrate at the polar angles $(\theta_3, \phi_2)$ relative to said coordinate system to interfere with the optical fields resulting from said illumination of said second mask and said second optical imaging system;

alignment means for adjusting substrate position or relative optical path lengths to ensure proper phase relationship between frequency components of said first and said second exposures;

resulting in said second exposure on said substrate characterized by:

two offset center spatial frequencies at $+[\sin(\theta_2)+\sin(\theta_3-\theta_2)]/\lambda_2$ and $-[\sin(\theta_2)+\sin(\theta_3-\theta_2)]/\lambda_2$ along the direction described by $\phi_2$;

spatial frequency components within at least a portion of circles of radius $(1+\sigma_2)NA_2/\lambda_2$ in spatial frequency space centered at each of said offset center spatial frequency; wherein relative amplitudes and phases of spatial frequency components within at least said portions of said circles substantially reproduce those of desired pattern on said substrate.

18. The process of claim 17 wherein said angle $\theta_2$ is fixed at $\theta_3/2$ thereby resulting in a symmetrical illumination of said photosensitive material on said substrate wherein centerline of said second optical imaging system is at an angle of $-\theta_3/2$ to said substrate and centerline of said imaging optical means is at an angle of $+\theta_3/2$ to said substrate and further said center spatial frequencies are respectively $+2 \sin(\theta_3/2)/\lambda_2$ and $-2 \sin(\theta_3/2)/\lambda_2$ along the direction described by $\phi_2$.

19. The process of claim 17 wherein said angle $\theta_2$ is fixed at 0 thereby said second mask and said substrate are perpendicular to centerline of said second optical imaging system and further said center spatial frequencies are respectively $+\sin(\theta_3)/\lambda_2$ and $-\sin(\theta_3)/\lambda_2$ along the direction described by $\phi_2$.

20. The process of claim 14 wherein said second mask and said third mask contain the substantially the same spatial patterns and further said second optical imaging system and said optical means provide substantially equivalent numerical apertures such that said two-dimensional pattern on said photosensitive material on said substrate is characterized by the demagnified spatial pattern of said masks convoluted with a high-spatial frequency component at a spatial frequency of $2 \sin(\theta_2/2)$.

21. The process of claim 17 wherein said second mask and said third mask contain the substantially the same spatial patterns and further said second optical imaging system and said optical means provide substantially equivalent numerical apertures such that said two-dimensional pattern on said photosensitive material on said substrate is characterized by the demagnified spatial pattern of said masks convoluted with a high-spatial frequency component at a spatial frequency of $2 \sin(\theta_2/2)$.

22. The process of claim 14 further includes the case wherein said second and third masks are constructed such that the amplitudes and phases of the spatial frequency components resulting from said illuminations of said masks are substantially the same as those desired in the final image within said regions of frequency space without any constraints as to amplitudes and phases of the spatial frequency components resulting in other regions of frequency space not collected by said second optical system and said optical means.

23. The process of claim 17 further includes the case wherein said second and third masks are constructed such that the amplitudes and phases of the spatial frequency components resulting from said illuminations of said masks are substantially the same as those desired in the final image within said regions of frequency space without any constraints as to amplitudes and phases of the spatial frequency components resulting in other regions of frequency space not collected by said second optical system and said optical means.

24. The process of claim 14 further includes the case wherein said second and third masks are constructed such that: the amplitudes and phases of the spatial frequency components resulting from said illumination of said mask are substantially the same as, but shifted in spatial frequency from, those desired in the final image and said optical imaging system is adjusted such that said spatial frequencies print in the desired regions of frequency space on said substrate without any constraint on the spatial frequency components not within said regions of frequency space.

25. The process of claim 17 further includes the case wherein said second and third masks are constructed such that: the amplitudes and phases of the spatial frequency components resulting from said illumination of said mask are substantially the same as, but shifted in spatial frequency from, those desired in the final image and said optical imaging system is adjusted such that said spatial frequencies print in the desired regions of frequency space on said substrate without any constraint on the spatial frequency components not within said regions of frequency space.

26. The process of claim 13 further includes the process of optically producing said masks, using a complete mask and said coherently illuminated imaging interferometric optical system, said optically producing step includes the process of:
 imaging said desired regions of frequency space onto a blank, photoresist coated, mask blank at least a portion of which is located in the substrate plane; and,
 thereafter processing said mask blank to develop said photoresist and to transfer said optically produced pattern to said mask.

27. The process of claim 14 wherein said two-dimensional pattern of said second mask includes structures with edges predominantly oriented along orthogonal directions x and y thereby making it advantageous to align said polar angle $\phi_2$ along said x-direction to encompass high spatial frequencies engendered by small structures with small dimensions along the corresponding x-axis; and further in a third exposure aligning $\phi_2$ along the orthogonal y-axis to encompass high spatial frequencies engendered by structures with small dimensions in the corresponding y-axis to maximize the spatial frequency coverage for rectilinear layout spatial patterns.

28. The process of claim 17 wherein said two-dimensional pattern of said second mask includes structures with edges predominantly oriented along orthogonal directions x and y thereby making it advantageous to align said polar angle $\phi_2$ along said x-direction to encompass high spatial frequencies engendered by small structures with small dimensions along the corresponding x-axis; and further in a third exposure aligning $\phi_2$ along the orthogonal y-axis to encompass high spatial frequencies engendered by structures with small dimensions in the corresponding y-axis to maximize the spatial frequency coverage for rectilinear layout spatial patterns.

29. The process of claim 22 further includes the process of:
 aligning said offset center spatial frequency of said second exposure along the x-frequency-axis to encompass high spatial frequencies engendered by small structures with small dimensions along the corresponding x-spatial axis; and
 aligning said the center spatial frequency of said third exposure along the orthogonal y-frequency-axis to encompass high spatial frequencies engendered by small structures with small dimensions in the corresponding y-spatial axis to maximize the spatial frequency coverage for rectilinear layout spatial patterns.

30. The process of claim 23 further includes the process of:
 aligning said offset center spatial frequency of said second exposure along the x-frequency-axis to encompass high spatial frequencies engendered by small structures with small dimensions along the corresponding x-spatial axis; and
 aligning said the center spatial frequency of said third exposure along the orthogonal y-frequency-axis to encompass high spatial frequencies engendered by small structures with small dimensions in the corresponding y-spatial axis to maximize the spatial frequency coverage for rectilinear layout spatial patterns.

31. The process of claim 24 further includes the process of:
 aligning said offset center spatial frequency of said second exposure along the x-frequency-axis to encompass high spatial frequencies engendered by small structures with small dimensions along the corresponding x-spatial axis; and
 aligning said offset center spatial frequency of said third exposure along the orthogonal y-frequency-axis to encompass high spatial frequencies engendered by small structures with small dimensions in the corresponding y-spatial axis to maximize the spatial frequency coverage for rectilinear layout spatial patterns.

32. The process of claim 25 further includes the process of:
 aligning said offset center spatial frequency of said second exposure along the x-frequency-axis to encompass high spatial frequencies engendered by small structures with small dimensions along the corresponding x-spatial axis; and
 aligning said offset center spatial frequency of said third exposure along the orthogonal y-frequency-axis to encompass high spatial frequencies engendered by small structures with small dimensions in the corresponding y-spatial axis to maximize the spatial frequency coverage for rectilinear layout spatial patterns.

33. The process of claim 1 wherein said first exposure and said second exposure are derived from a single coherent radiation source.

34. The process of claim 1 wherein spatial frequencies of said two-dimensional spatial pattern are extended through the use of nonlinearities.

35. A two-dimensional spatial pattern in a photosensitive material on a substrate resulting from the process of claim 1.

* * * * *